United States Patent
Kano et al.

(10) Patent No.: US 10,243,489 B2
(45) Date of Patent: Mar. 26, 2019

(54) ROTARY ELECTRIC MACHINE CONTROL APPARATUS AND ELECTRIC POWER STEERING APPARATUS USING THE SAME

(71) Applicant: DENSO CORPORATION, Kariya, Aichi-pref. (JP)

(72) Inventors: Ryo Kano, Kariya (JP); Takashi Suzuki, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/880,264

(22) Filed: Jan. 25, 2018

(65) Prior Publication Data

US 2018/0219499 A1   Aug. 2, 2018

(30) Foreign Application Priority Data

Jan. 27, 2017   (JP) .................. 2017-013079

(51) Int. Cl.
| | |
|---|---|
| *H02P 6/10* | (2006.01) |
| *B62D 5/04* | (2006.01) |
| *H02P 25/22* | (2006.01) |
| *G01R 19/00* | (2006.01) |
| *H02P 21/20* | (2016.01) |
| *H02P 29/024* | (2016.01) |
| *H02P 29/032* | (2016.01) |

(52) U.S. Cl.
CPC .............. *H02P 6/10* (2013.01); *B62D 5/0484* (2013.01); *B62D 5/0496* (2013.01); *G01R 19/0053* (2013.01); *H02P 21/20* (2016.02); *H02P 25/22* (2013.01); *H02P 29/027* (2013.01); *H02P 29/032* (2016.02)

(58) Field of Classification Search
CPC ........ H02P 21/20; H02P 29/032; H02P 25/22; H02P 6/10; H02P 29/027; B62D 5/0484; B62D 5/0496; G01R 19/0053
USPC .......... 318/434, 641, 400.08, 400.21, 400.22, 318/788, 792
See application file for complete search history.

(56) References Cited

U.S. PATENT DOCUMENTS

2005/0242760 A1* 11/2005 Fujita ................. H02P 23/14
                                                        318/434
2005/0257986 A1* 11/2005 Kagei ................ B62D 5/0463
                                                        180/404

(Continued)

FOREIGN PATENT DOCUMENTS

| JP | 2012-111474 A | 6/2012 |
|---|---|---|
| JP | 2016-019330 A | 2/2016 |
| JP | 2016-092944 A | 5/2016 |

*Primary Examiner* — Jorge L Carrasquillo
(74) *Attorney, Agent, or Firm* — Knobbe, Martens, Olson & Bear, LLP

(57) ABSTRACT

In a rotary electrical machine control apparatus, a selection section selects a relay current limiting value or a coil current limiting value depending on whether a plurality of systems are operated or one or more but not all of the plurality of systems are operated. The system is a combination of a winding set, an inverter, and a power supply relay, which correspond to each other. The relay current limiting value is a current limiting value calculated based on the temperature of the power supply relay. The coil current limiting value is a current limiting value calculated based on the temperature of a choke coil.

10 Claims, 16 Drawing Sheets

(56) References Cited

U.S. PATENT DOCUMENTS

| | | | |
|---|---|---|---|
| 2011/0032001 A1* | 2/2011 | Hasegawa | G01K 3/005 |
| | | | 327/1 |
| 2011/0156627 A1 | 6/2011 | Nakamura et al. | |
| 2014/0358391 A1* | 12/2014 | Kakihara | G01K 15/007 |
| | | | 701/70 |
| 2015/0211938 A1* | 7/2015 | Imakiire | H02M 1/32 |
| | | | 702/133 |
| 2016/0006387 A1 | 1/2016 | Nakamura et al. | |
| 2016/0043670 A1* | 2/2016 | Nakamura | H02P 27/085 |
| | | | 318/400.17 |
| 2016/0126877 A1 | 5/2016 | Endoh | |
| 2017/0001661 A1* | 1/2017 | Nakamura | B62D 5/0496 |
| 2017/0104439 A1* | 4/2017 | Kobayashi | H02P 29/68 |
| 2017/0126104 A1* | 5/2017 | Yamanaka | H02K 11/25 |

* cited by examiner

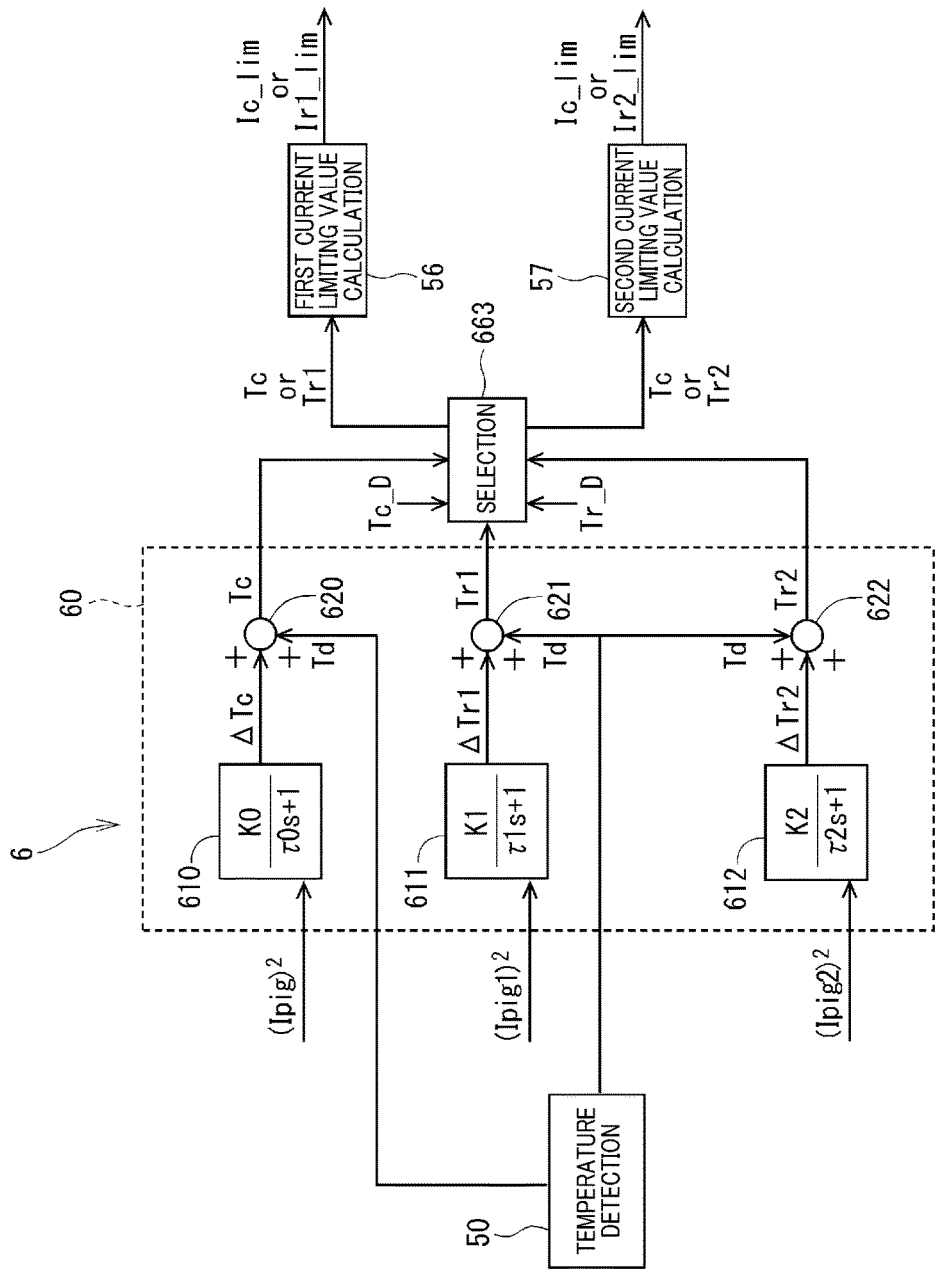

ROTARY ELECTRIC MACHINE CONTROL APPARATUS AND ELECTRIC POWER STEERING APPARATUS USING THE SAME

CROSS-REFERENCE TO RELATED APPLICATION

This application is based on and claims the benefit of priority from earlier Japanese Patent Application No. 2017-13079 filed Jan. 27, 2017, the description of which is incorporated herein by reference.

BACKGROUND

Technical Field

The present disclosure relates to a rotary electric machine control apparatus and an electric power steering apparatus using the same.

Related Art

Conventionally, a rotary electric machine control apparatus is known which estimates a temperature of a coil or an electronic component configuring an inverter and limits a current command value to prevent overheating. In JP-A-2016-92944, a temperature change amount is added to a sensor value of a temperature sensor to calculate a temperature estimation value.

The combination of a winding set and an inverter is defined as a system. JP-A-2016-92944 discloses temperature estimation for one system. However, JP-A-2016-92944 does not disclose temperature estimation for a plurality of systems. In the case of a plurality of systems, the amount of temperature change may be estimated as large depending on drive conditions, and current maybe be limited excessively. Hence, sufficient performance of a motor, which is a rotary electric machine, may not be offered.

SUMMARY

An embodiment provides a rotary electric machine control apparatus and an electric power steering apparatus using the same, in which accuracy in temperature estimation for a plurality of systems is improved, thereby avoiding excessive current limitation for the rotary electric machine.

As an aspect of the embodiment, a rotary electrical machine control apparatus is provided which controls a rotary electrical machine having a plurality of winding sets. The apparatus includes: inverters that are provided to correspond to the respective winding sets and have a plurality of switching elements; power supply relays that are provided to correspond to the respective winding sets and allow current to flow to the inverters or interrupt the flow; a choke coil that is provided between a power supply and the power supply relays to suppress noise; a substrate on which the inverters, the power supply relays, and the choke coil are mounted; a heatsink that releases heat of the switching elements; a temperature detection section that detects a temperature of the substrate, a temperature of the heatsink, or an outside air temperature; a temperature estimation section that estimates temperatures of the power supply relays or a temperature of the choke coil based on temperature change amounts of the power supply relays, a temperature change amount of the choke coil, and a temperature detected by the temperature detection section; a current limit calculation section that calculates a current limiting value, which is a limiting value of a current flowing from the power supply to the inverter, based on the temperature of the power supply relay and the temperature of the choke coil; a selection section that selects a relay current limiting value or a coil current limiting value depending on whether a plurality of systems are operated or one or more but not all of the plurality of systems are operated, wherein the system is a combination of the winding set, the inverter, and the power supply relay, which correspond to each other, the relay current limiting value is the current limiting value calculated based on the temperature of the power supply relay, and the coil current limiting value is the current limiting value calculated based on the temperature of the choke coil.

BRIEF DESCRIPTION OF THE DRAWINGS

In the accompanying drawings:

FIG. 16 is a block diagram of a control section of a motor control apparatus according to another embodiment.

DETAILED DESCRIPTION OF THE PREFERRED EMBODIMENTS

Figure 1:
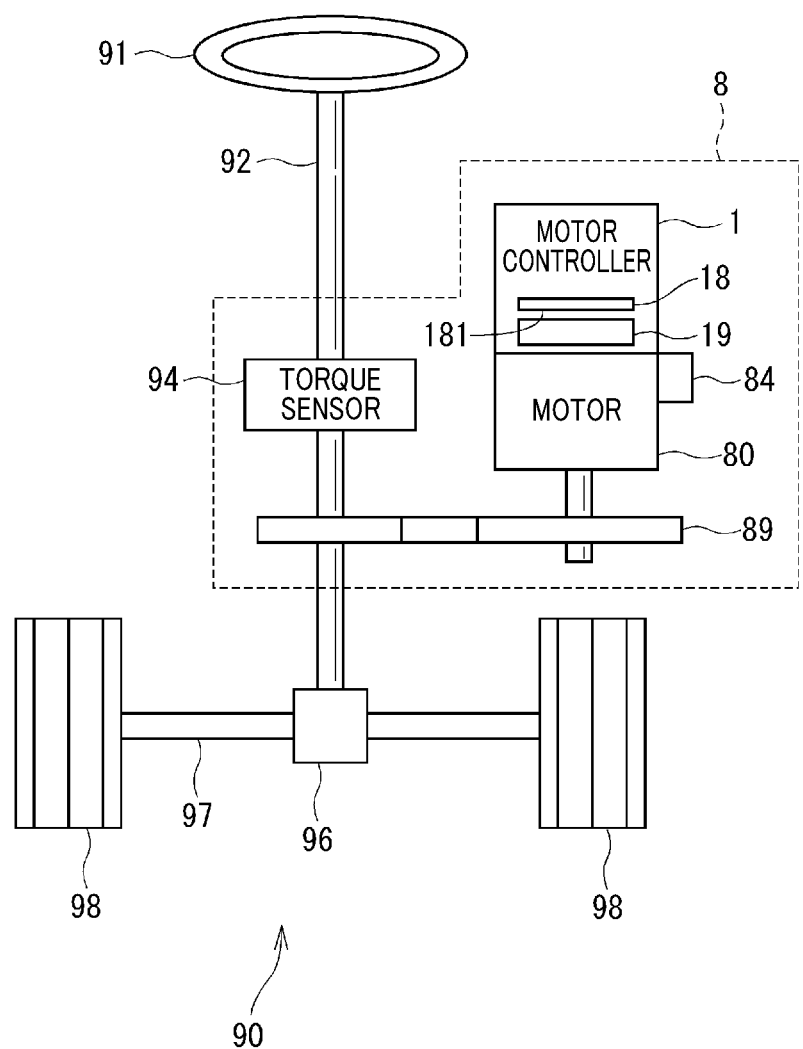
FIG. 1 is a diagram schematically showing the configuration of a steering system according to a first embodiment.

Hereinafter, a rotary electric machine control apparatus and an electric power steering apparatus using the same according to embodiments will be described with reference to the drawings. Hereinafter, substantially the same components are denoted by the same reference numeral to omit the descriptions thereof. A plurality of embodiments are included in "the present embodiment".

First, an electric power steering apparatus 8 will be described which uses a motor controller serving as a rotary electric machine control apparatus of the present embodiment.

As shown in FIG. 1, the electric power steering apparatus 8 is used for a steering system 90.

The steering system 90 is installed in a vehicle and includes a steering wheel 91, a steering shaft 92, a torque sensor 94, a pinion gear 96, a rack shaft 97, wheels 98, and the electric power steering apparatus 8.

The steering wheel 91 is a steering member and is connected to the steering shaft 92. The torque applied by operation of the steering wheel 91 by the driver is referred to as steering torque.

The tip of the steering shaft 92 is provided with the pinion gear 96.

The torque sensor 94 can detect steering torque. The detected steering torque is output to a control section 30 of a motor controller 1.

The pinion gear 96 engages with the rack shaft 97.

Two ends of the rack shaft 97 are connected with a pair of wheels 98 via tie rods and the like.

The electric power steering apparatus 8 includes a reduction gear 89, a motor 80 serving as a rotary electric machine, a rotation angle sensor 84, and the motor controller 1.

The electric power steering apparatus 8 is a so-called column assist type. Alternatively, the electric power steering apparatus 8 may be a so-called rack assist type that transmits rotation of the motor 80 to the rack shaft 97.

The reduction gear 89 reduces rotation of the motor 80 and transmits the reduced rotation to the steering shaft 92.

The torque assisting the steering of the steering wheel 91 by the driver is referred to as auxiliary torque.

The motor 80 outputs auxiliary torque. Electric power is supplied from a battery 9 serving as a power supply to the motor 80 to drive the motor 80. The motor 80 rotates the reduction gear 89 in the positive or negative direction.

The rotation angle sensor 84 is, for example, a resolver and can detect an electrical angle $\theta$ of the motor 80. The detected electrical angle $\theta$ is output to the control section 30.

In addition, the rotation angle sensor 84 can calculate a rotation angular velocity $\omega$ of the motor 80 based on the electrical angle $\theta$.

First Embodiment

Figure 2:
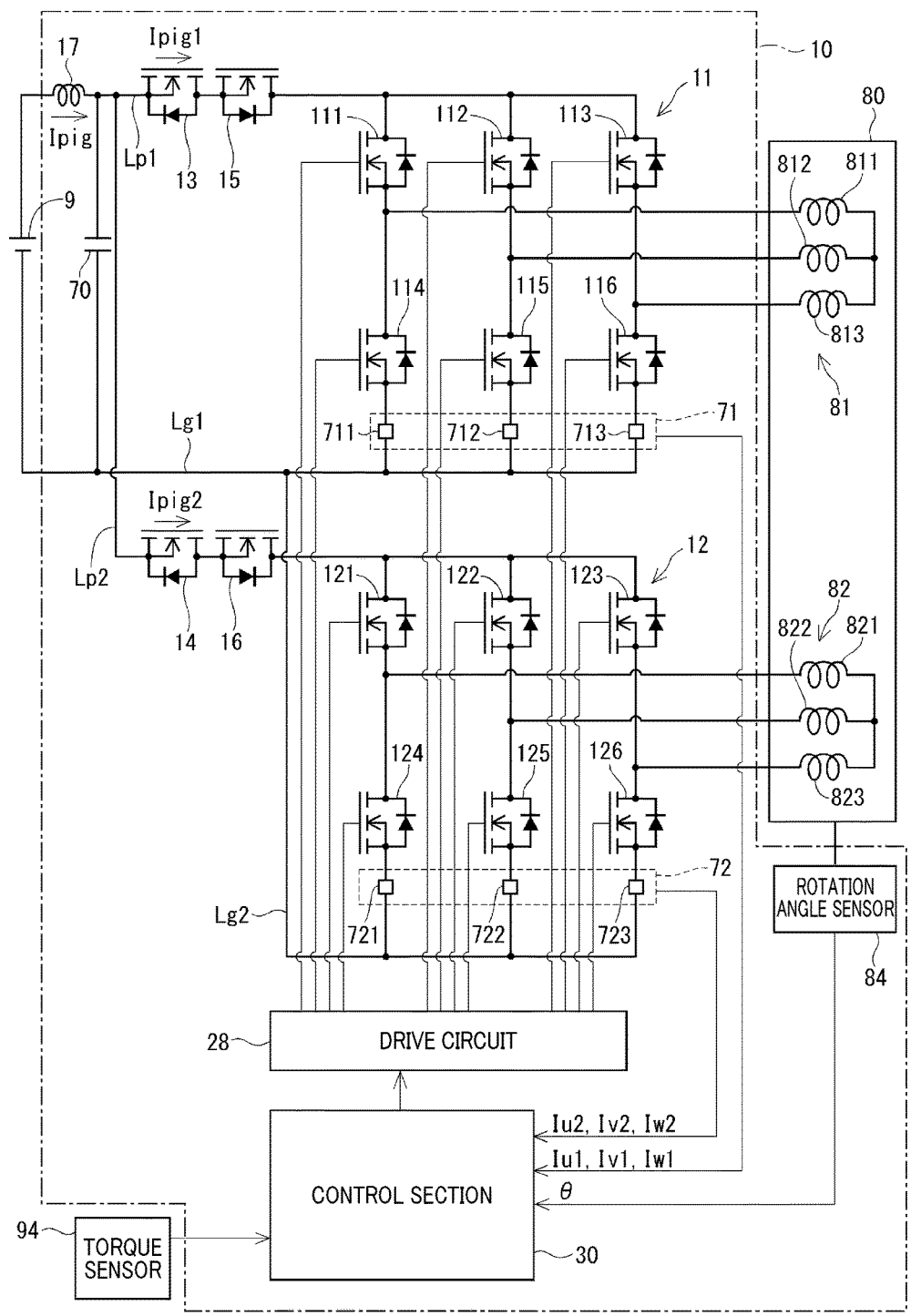
FIG. 2 is a circuit diagram of a motor control apparatus according to the first embodiment.

As shown in FIG. 2, the motor 80 is a three-phase AC motor and a brushless motor.

The motor 80 has two sets of winding sets 81 and 82. One of the winding sets 81 and 82 is referred to as a first winding set 81. The other of the winding sets 81 and 82 is referred to as a second winding set 82.

The first winding set 81 has a first U-phase coil 811, a first V-phase coil 812, and a first W-phase coil 813. One end of each of the coils 811, 812, and 813 is connected to a first inverter 11, and the other ends of the coils 811, 812, and 813 are connected to each other.

The second winding set 82 has a second U-phase coil 821, a second V-phase coil 822, and a second W-phase coil 823. One end of each of the coils 821, 822, and 823 is connected to a second inverter 12, and the other ends of the coils 821, 822, and 823 are connected to each other.

In the present embodiment, the first winding set 81 and the second winding set 82 are arranged so as to be displaced from each other by a predetermined electrical angle. Electric power in which phases are displaced from each other depending on the displacement of the electrical angle is supplied to the winding sets 81 and 82.

The motor controller 1 includes the first inverter 11, the second inverter 12, a capacitor 70, a first power supply relay 13, a second power supply relay 14, a first reverse connection protection relay 15, and a second reverse connection protection relay 16.

In addition, the motor controller 1 includes a first current detection section 71, a second current detection section 72, a choke coil 17, a substrate 18, a heatsink 19, and the control section 30.

The motor controller 1 is provided at one side of the motor 80 in the axial direction.

The motor 80 and the motor controller 1 are integrated.

The first inverter 11 is provided so as to correspond to the first winding set 81 and is a three-phase inverter.

The first inverter 11 has a plurality of first switching elements 111 to 116.

The first switching elements 111 to 113 are connected to the high potential side.

The first switching elements 114 to 116 are connected to the low potential side.

The connection point between the U-phase first switching elements 111 and 114, which are paired with each other, is connected to the first U-phase coil 811.

The connection point between the V-phase first switching elements 112 and 115, which are paired with each other, is connected to the first V-phase coil 812.

The connection point between the W-phase first switching elements 113 and 116, which are paired with each other, is connected to the first W-phase coil 813.

The second inverter 12 is provided so as to correspond to the second winding set 82 and is a three-phase inverter.

The second inverter 12 has a plurality of second switching elements 121 to 126.

The second switching elements 121 to 123 are connected to the high potential side.

The second switching elements 124 to 126 are connected to the low potential side.

The connection point between the U-phase second switching elements 121 and 124, which are paired with each other, is connected to the second U-phase coil 821.

The connection point between the V-phase second switching elements 122 and 125, which are paired with each other, is connected to the second V-phase coil 822.

The connection point between the W-phase second switching elements 123 and 126, which are paired with each other, is connected to the second W-phase coil 823.

The switching elements 111 to 116 and 121 to 126 are MOSFETs (metal-oxide semiconductor field-effect transistors). The switching elements 111 to 116 and 121 to 126 may be IGBTs (insulated gate bipolar transistors).

The inverters 11 and 12 are connected to a battery 9 serving as a power supply in parallel.

The capacitor 70 is connected to the battery 9 in parallel.

In addition, the capacitor 70 has a function of suppressing normal mode noise of the battery 9 and a function of smoothing voltage fluctuation of the battery 9.

The first power supply relay 13 is provided so as to correspond to the first winding set 81 and between the battery 9 and the first inverter 11, and is connected to a high potential line Lp1.

The second power supply relay 14 is provided so as to correspond to the second winding set 82 and between the battery 9 and the second inverter 12, and is connected to a high potential line Lp2.

The power supply relays 13 and 14 are MOSFETs. The power supply relays 13 and 14 may be IGBTs or mechanical relays.

The first power supply relay 13 allows a current flowing from the battery 9 to the first inverter 11 or interrupts the flow.

The second power supply relay 14 allows a current flowing from the battery 9 to the second inverter 12 or interrupts the flow.

The first reverse connection protection relay 15 is provided between the first inverter 11 and the first power supply relay 13.

The second reverse connection protection relay 16 is provided between the second inverter 12 and the second power supply relay 14.

The reverse connection protection relays 15 and 16 are MOSFETs as well as the power supply relays 13 and 14.

In addition, the reverse connection protection relays 15 and 16 are connected so that respective orientations of the parasitic diodes are opposite to those of the parasitic diodes of the power supply relays 13 and 14.

If the battery 9 is connected inversely, the reverse connection protection relays 15 and 16 interrupt inverse currents flowing from the inverters 11 and 12 to the power supply relays 13 and 14.

Hence, the reverse connection protection relays 15 and 16 protect the motor controller 1.

Respective combinations of the winding sets 81 and 82, the inverters 11 and 12, the power supply relays 13 and 14, and the reverse connection protection relays 15 and 16, which are provided so as to correspond to one another, are defined as systems. The number of the systems is N. N is an integer equal to or more than 2. In the present embodiment, N=2 is set for the sake of clarity. One of the systems is defined as a first system. The other of the systems is defined as a second system.

The first system is the combination of the first winding set 81, the first inverter 11, the first power supply relay 13, and the first reverse connection protection relay 15.

The second system is the combination of the second winding set 82, the second inverter 12, the second power supply relay 14, and the second reverse connection protection relay 16.

The first current detection section 71 has current detection elements 711 to 713.

The current detection element 711 is provided between the first switching element 114 and a ground line Lg1, and detects a first U-phase current Iu1 flowing to the first U-phase coil 811.

The current detection element 712 is provided between the first switching element 115 and the ground line Lg1, and detects a first V-phase current Iv1 flowing to the first V-phase coil 812.

The current detection element 713 is provided between the first switching element 116 and the ground line Lg1, and detects a first W-phase current Iw1 flowing to the first W-phase coil 813.

The second current detection section 72 has current detection elements 721 to 723.

The current detection element 721 is provided between the second switching element 124 and a ground line Lg2, and detects a second U-phase current Iu2 flowing to the second U-phase coil 821.

The current detection element 722 is provided between the second switching element 125 and the ground line Lg2, and detects a second V-phase current Iv2 flowing to the second V-phase coil 822.

The current detection element 723 is provided between the second switching element 126 and the ground line Lg2, and detects a second W-phase current Iw2 flowing to the second W-phase coil 823.

The current detection elements 711 to 713 and 721 to 723 are shunt resistors. The current detection elements 711 to 713 and 721 to 723 may be Hall elements.

The current detection sections 71 and 72 output detection values to the control section 30.

The choke coil 17 has a structure in which one lead wire is wound around one core, and is provided between the battery 9 and the power supply relays 13 and 14.

The choke coil 17 generates magnetic flux when a current flows therethrough. The choke coil 17 functions as an inductor and can suppress noise.

The substrate 18 has a surface 181 at the heatsink 19 side. On the surface 181, the inverters 11 and 12, the capacitor 70, the power supply relays 13 and 14, the reverse connection protection relays 15 and 16, the current detection sections 71 and 72, the choke coil 17, and the control section 30 are mounted.

The heatsink 19 has a plurality of fins, which are radiator plates, and can release heat of the switching elements 111 to 116 and 121 to 126

The control section 30 is mainly configured by a microcomputer and the like. Processes performed by the control section 30 may be software processes that a CPU performs by executing a program previously stored in a tangible memory such as a ROM, or hardware processes performed by a dedicated electronic circuit.

The control section 30 controls the motor 80 by current feedback control based on the steering torque, the electrical angle θ, the phase currents Iu1, Iv1, Iw1, Iu2, Iv2, Iw2, and the like.

Figure 3:
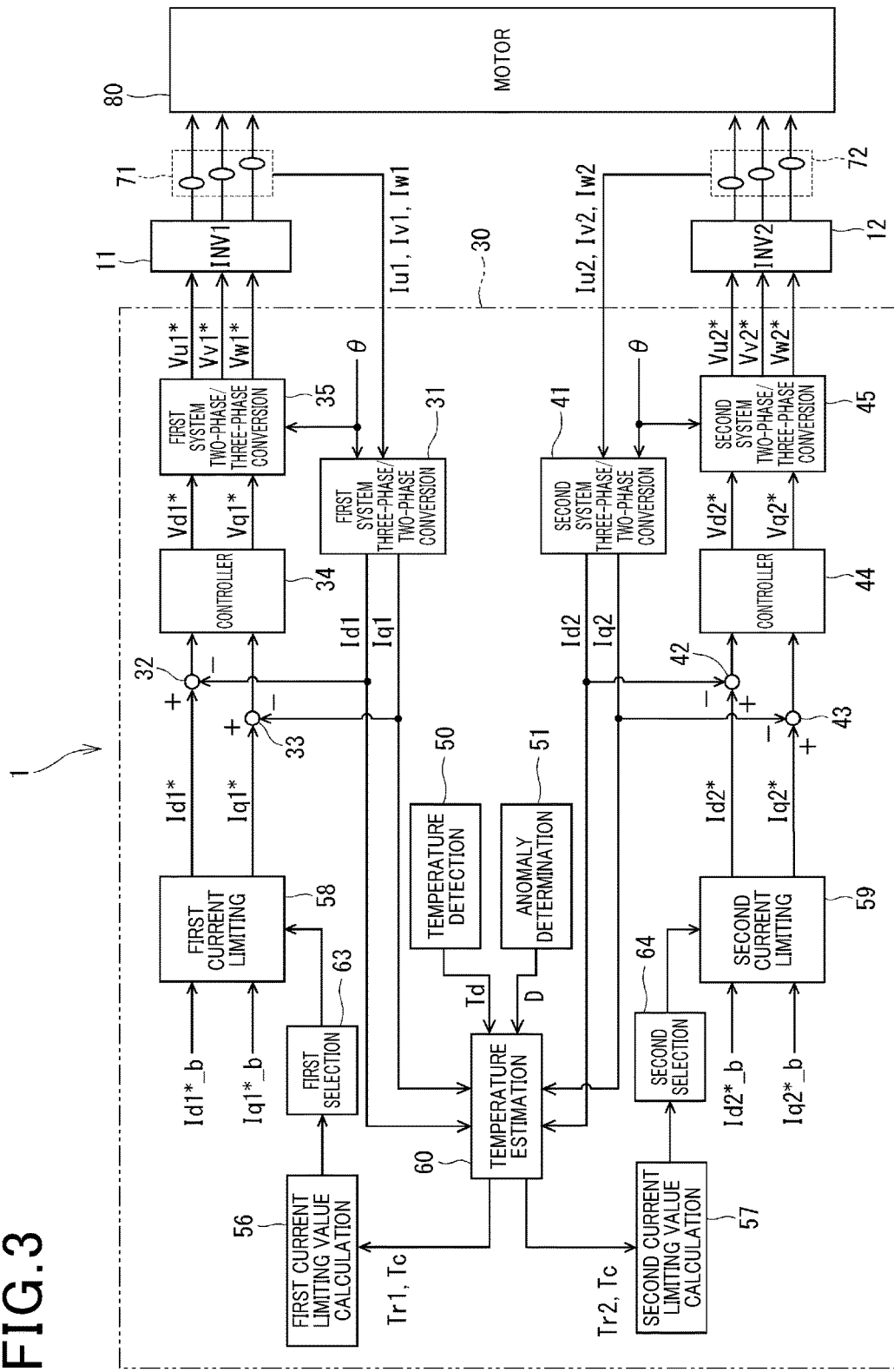
FIG. 3 is a block diagram of a control section of the motor control apparatus according to the first embodiment.

As shown in FIG. 3, the control section 30 has three-phase two-phase conversion sections 31 and 41, subtracters 32, 33, 42, and 43, controllers 34 and 44, two-phase three-phase conversion sections 35 and 45, a drive circuit 28, and an anomaly determination section 51.

The first system three-phase two-phase conversion section 31 performs dq conversion for the phase currents Iu1, Iv1, and Iw1 based on the electrical angle θ.

In addition, the first system three-phase two-phase conversion section 31 calculates a first d axis current detection value Id1 and a first q axis current detection value Iq1.

The subtracter 32 calculates a deviation (difference) ΔId1 between a first d axis current command value Id1* and a first d axis current detection value Id1.

The subtracter 33 calculates a deviation ΔIq1 between a first q axis current command value Iq1* and a first q axis current detection value Iq1.

The controller 34 calculates a first d axis voltage command value Vd1* and a first q axis voltage command value Vq1* by PI calculation or the like so that the deviations ΔId1 and ΔIq1 converge to 0.

The first system two-phase three-phase conversion section 35 performs inverse dq conversion for the first d axis voltage command value Vd1* and the first q axis voltage command value Vq1* based on the electrical angle θ.

In addition, the first system two-phase three-phase conversion section 35 calculates three-phase first voltage command values Vu1*, Vv1*, and Vw1*.

The second system three-phase two-phase conversion section 41 performs dq conversion for the phase currents Iu2, Iv2, and Iw2 based on the electrical angle θ.

In addition, the second system three-phase two-phase conversion section 41 calculates a second d axis current detection value Id2 and a second q axis current detection value Iq2.

The subtracter 42 calculates a deviation (difference) ΔId2 between a second d axis current command value Id2* and a second d axis current detection value Id2.

The subtracter 43 calculates a deviation ΔIq2 between a second q axis current command value Iq2* and a second q axis current detection value Iq2.

The controller 44 calculates a second d axis voltage command value Vd2* and a second q axis voltage command value Vq2* by PI calculation or the like so that the deviations ΔId2 and ΔIq2 converge to 0.

The second system two-phase three-phase conversion section 45 performs inverse dq conversion for the second d axis voltage command value Vd2* and the second q axis voltage command value Vq2* based on the electrical angle θ.

In addition, the second system two-phase three-phase conversion section 45 calculates three-phase second voltage command values Vu2*, Vv2*, and Vw2*.

The control section 30 generates a control signal for the first inverter 11 based on the first voltage command values Vu1*, Vv1*, and Vw1*. The generated control signal is transmitted to the first inverter 11 through the drive circuit 28, whereby the control section 30 controls on-off operation of the switching elements 111 to 116.

In addition, the control section 30 generates a control signal for the second inverter 12 based on the second voltage command values Vu2*, Vv2*, and Vw2*. The generated control signal is transmitted to the second inverter 12 through the drive circuit 28, whereby the control section 30 controls on-off operation of the switching elements 121 to 126.

The anomaly determination section 51 determines whether or not an anomaly has occurred in the first system or the second system.

In addition, the anomaly determination section 51 determines, for example, a power supply fault, an earth fault, a disconnection, a short-circuit fault of the switching elements 111 to 116 and 121 to 126, or an open fault of the switching elements 111 to 116 and 121 to 126.

The anomaly determination section 51 determines an anomaly by using, for example, detection values of the current detection sections 71 and 72.

Furthermore, the anomaly determination section 51 outputs a signal D of anomaly determination to a temperature estimation section 60 and selection sections 63 and 64.

When both the first system and the second system are in normal states, the motor 80 is driven by using the first system and the second system.

If an anomaly has occurred in the first system, the first system is stopped, and the motor 80 is driven by using the second system.

If an anomaly has occurred in the second system, the second system is stopped, and the motor 80 is driven by using the first system. Driving the motor 80 by using the first system and the second system is referred to as dual system drive. Driving the motor 80 by using the first system or the second system is referred to as single system drive.

Conventionally, a motor control apparatus is known which estimates a temperature of a coil or an inverter and limits a current command value to prevent overheating. In JP-A-2016-92944, the amount of temperature change is added to a sensor value of a temperature sensor to calculate a temperature estimation value. However, JP-A-2016-92944 does not disclose temperature estimation for a plurality of systems. In the case of a plurality of systems, the amount of temperature change may be estimated as large depending on drive conditions, and current maybe be limited excessively. Hence, sufficient performance of a motor, which is a rotary electric machine, may not be offered.

Hence, the motor controller 1 of the present embodiment has improved accuracy in temperature estimation for a plurality of systems, thereby avoiding excessive current limitation for a rotary electric machine.

The control section 30 further has a temperature detection section 50, a temperature estimation section 60, current limit calculation sections 56 and 57, selection sections 63 and 64, and current limiting sections 58 and 59.

The temperature detection section 50 is, for example, a thermistor, which is a ceramic semiconductor whose electrical resistance changes depending on temperature. The temperature of the substrate 18 is referred to as a substrate temperature Tb. The substrate temperature Tb includes ambient temperature around the substrate 18. The temperature of the heatsink 19 is referred to as a heatsink temperature Th. The ambient temperature outside the motor controller 1 is referred to as outside air temperature Ta.

In addition, the temperature detection section 50 can detect the substrate temperature Tb, the heatsink temperature Th, or the outside air temperature Ta. The temperature detected by the temperature detection section 50 is referred to as a detection temperature Td.

The temperature detection section 50 outputs the detection temperature Td to the temperature estimation section 60.

By applying currents to the power supply relays 13 and 14 and the choke coil 17, the power supply relays 13 and 14 and the choke coil 17 produce heat, and the temperature changes.

The temperature of the first power supply relay 13 is referred to as a first relay temperature Tr1. The temperature of the second power supply relay 14 is referred to as a second relay temperature Tr2. The amount of temperature change of the first power supply relay 13 due to the current application is referred to as a first relay temperature change amount ΔTr1. The amount of temperature change of the second power supply relay 14 due to the current application is referred to as a second relay temperature change amount ΔTr2. The heat-resistant temperature of the power supply relays 13 and 14 is referred to as a relay heat-resistant temperature Tr_D.

The relay heat-resistant temperature Tr_D is the maximum temperature specified for semiconductors used for the power supply relays 13 and 14 or the temperature at which the power supply relays 13 and 14 burn out.

The temperature of the choke coil 17 is referred to as a coil temperature Tc. The amount of temperature change of the choke coil 17 due to the current application is referred to as a coil temperature change amount ΔTc. The heat-resistant temperature of the choke coil 17 is referred to as coil heat-resistant temperature Tc_D.

At the coil heat-resistant temperature Tc_D, the choke coil 17 burns out.

The current flowing through the first power supply relay 13 is referred to as a first relay current Ipig1. The current flowing through the second power supply relay 14 is referred to as a second relay current Ipig2. The current flowing through the choke coil 17 is referred to as a coil current Ipig. When the two systems are operated, the following relational expression (1) is satisfied.

The temperature estimation section 60 can detect or estimate the first relay current Ipig1, the second relay current Ipig2, and the coil current Ipig.

$$Ipig = Ipig1 + Ipig2 \quad (1)$$

The current flowing through the first reverse connection protection relay 15 is equivalent to the first relay current Ipig1.

The current flowing through the second reverse connection protection relay 16 is equivalent to the second relay current Ipig2.

The square of the first relay current Ipig1 is referred to as a first relay current square value $(Ipig1)^2$. The square of the second relay current Ipig2 is referred to as a second relay current square value $(Ipig2)^2$. The square of the coil current Ipig is referred to as a coil current square value $(Ipig)^2$.

The temperature estimation section 60 estimates the relay temperatures Tr1 and Tr2 based on the relay temperature change amount ΔTr1 and ΔTr2 and the detection temperature Td.

In addition, the temperature estimation section 60 estimates the coil temperature Tc based on the coil temperature change amount ΔTc and the detection temperature Td.

The temperature estimation section 60 outputs the first relay temperature Tr1 and the coil temperature Tc to the first current limit calculation section 56.

In addition, the temperature estimation section 60 outputs the second relay temperature Tr2 and the coil temperature Tc to the second current limit calculation section 57.

Figure 4:
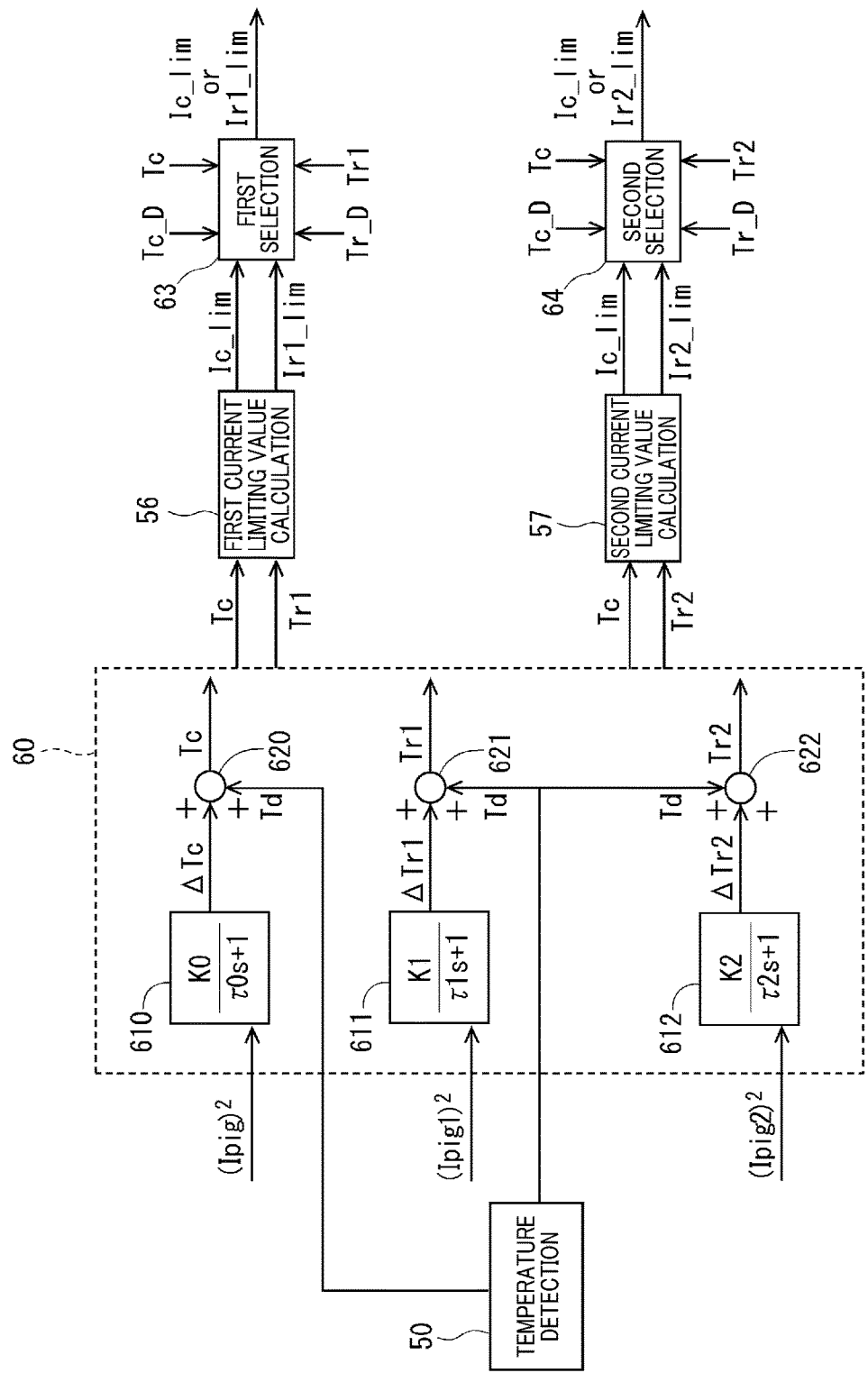
FIG. 4 is a block diagram of a temperature estimation section of the motor control apparatus according to the first embodiment.

As shown in FIG. 4, the temperature estimation section 60 has a plurality of first-order lag calculators 610 to 612, and a plurality of adders 620 to 622.

The first-order lag calculator 610 receives the coil current square value $(Ipig)^2$, a gain K0, and a time constant τ0.

The first-order lag calculator 610 calculates a first-order lag response from the inputs by using a transfer function satisfying the relational expression (2) and calculates the coil temperature change amount ΔTc. It is noted that s indicates a Laplace operator.

$$K0/(\tau 0 \cdot s + 1) \quad (2)$$

The first-order lag calculator 611 receives the first relay current square value $(Ipig1)^2$, a gain K1, and a time constant τ1.

The first-order lag calculator 611 calculates a first-order lag response from the inputs by using a transfer function satisfying the relational expression (3) and calculates the first relay temperature change amount ΔTr1, $$K1/(\tau 1 \cdot s + 1) \quad (3)$$

The first-order lag calculator 612 receives the second relay current square value $(Ipig2)^2$, a gain K2, and a time constant τ2.

The first-order lag calculator 612 calculates a first-order lag response from the inputs by using a transfer function satisfying the relational expression (4) and calculates the second relay temperature change amount ΔTr2, $$K2/(\tau 2 \cdot s + 1) \quad (4)$$

The adder 620 adds the detection temperature Td to the coil temperature change amount ΔTc to calculate the coil temperature Tc.

The adder 621 adds the detection temperature Td to the first relay temperature change amount ΔTr1 to calculate the first relay temperature Tr1.

The adder 622 adds the detection temperature Td to the second relay temperature change amount ΔTr2 to calculate the second relay temperature Tr2.

The difference between the relay heat-resistant temperature Tr_D and the relay temperatures Tr1 and Tr2 is referred to as a relay temperature difference ΔTr_D. The difference between the coil heat-resistant temperature Tc_D and the coil temperature Tc is referred to as a coil temperature difference ΔTc_D. It is noted that the relay temperature difference ΔTr_D and the coil temperature difference ΔTc_D are absolute values.

The temperature of the power supply relays 13 and 14 when dual systems are operated is referred to as a dual system operation relay temperature Tr_T. The temperature of the power supply relays 13 and 14 when a single system is operated is referred to as a single system operation relay temperature Tr_S. The temperature of the choke coil 17 when dual systems are operated is referred to as a dual system operation coil temperature Tc_T. The temperature of the choke coil 17 when a single system is operated is referred to as a single system operation coil temperature Tc_S.

The relationship between the dual system operation relay temperature Tr_T and the single system operation relay temperature Tr_S is represented as the following relational expression (5).

The relationship between the dual system operation coil temperature Tc_T and the single system operation coil temperature Tr_S is represented as the following relational expression (6).

$$Tr\_T < Tr\_S \quad (5)$$

$$Tc\_T > Tc\_S \quad (6)$$

The limiting value of a current flowing from the battery 9 to the inverters 11 and 12 is referred to as a current limiting value.

The current limit calculation sections 56 and 57 calculate the current limiting value based on the relay temperatures Tr1 and Tr2 and the coil temperature Tc.

The current limiting value calculated based on the relay temperatures Tr1 and Tr2 is referred to as a relay current limiting value Ir_lim. The current limiting value calculated based on the coil temperature Tc is referred to as a coil current limiting value Ic_lim. It is noted that the relay current limiting value Ir_lim and the coil current limiting value Ic_lim are set so as to respectively correspond to the d axis current and the q axis current. The relay current limiting value Ir_lim and the coil current limiting value Ic_lim may be set for the first system or the second system.

Figure 5:
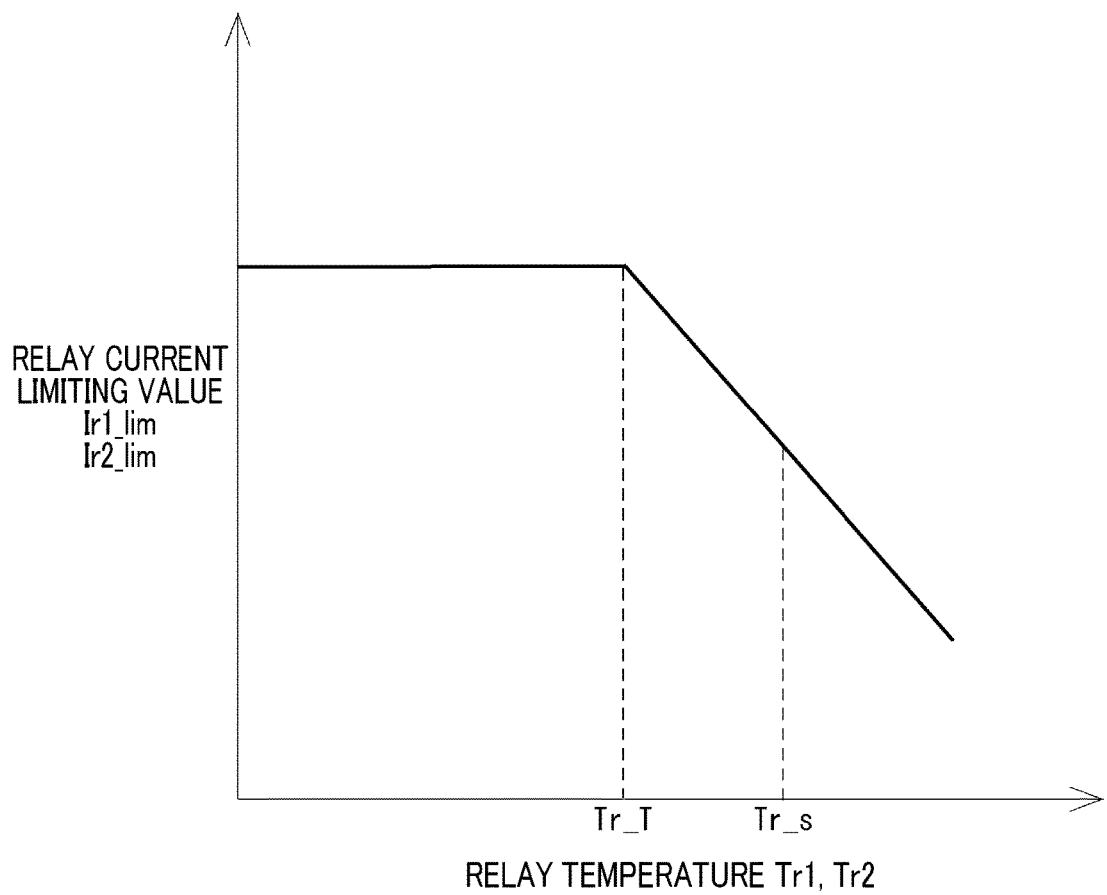
FIG. 5 is a diagram illustrating a relationship between relay temperatures and relay current limiting values in the motor control apparatus according to the first embodiment.

As shown in FIG. 5, the relay current limiting values Ir1_lim and Ir2_lim is set so as to be constant when the relay temperatures Tr1 and Tr2 are the dual system operation relay temperature Tr_T or less.

In addition, the relay current limiting values Ir1_lim and Ir2_lim are set so as to decrease when the first relay temperature Tr1 exceeds the dual system operation relay temperature Tr_T.

Figure 6:
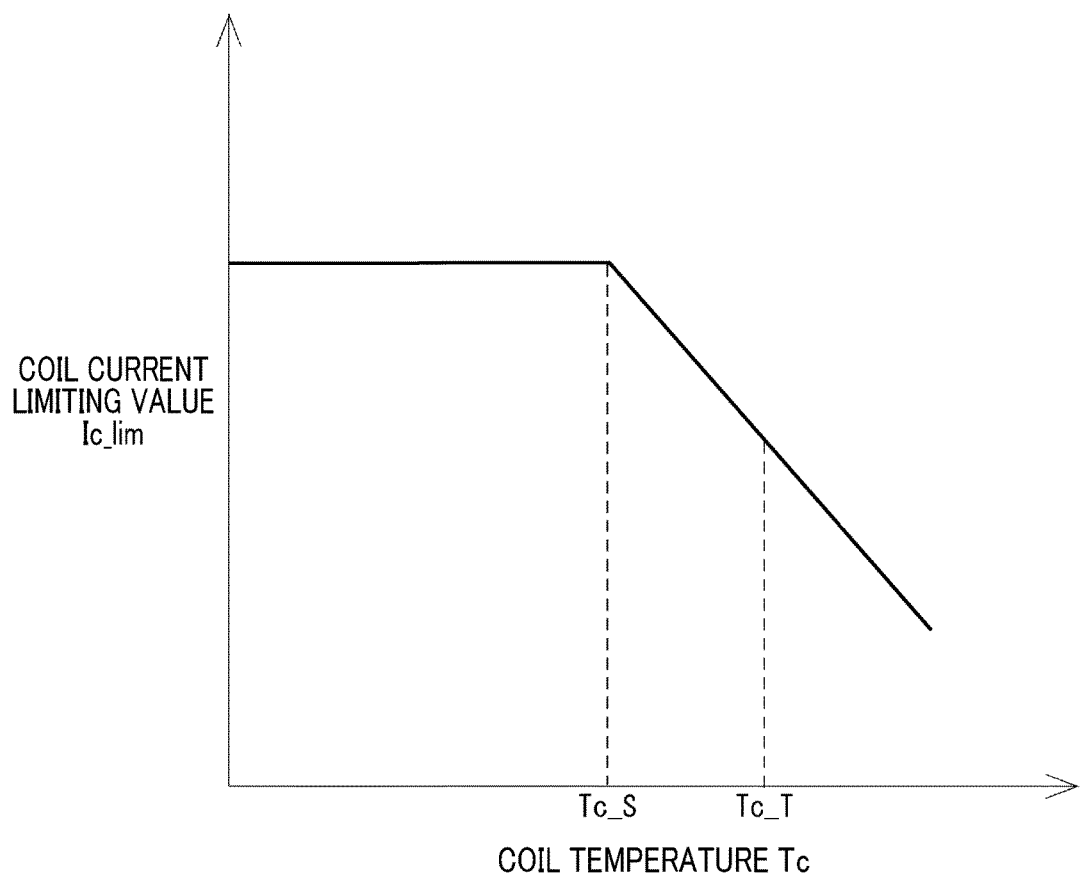
FIG. 6 is a diagram illustrating a relationship between coil temperatures and coil current limiting values in the motor control apparatus according to the first embodiment.

As shown in FIG. 6, the coil current limiting value Ic_lim is set so as to be constant when the coil temperature Tc is the single system operation coil temperature Tc_S or less.

In addition, the coil current limiting value Ic_lim is set so as to decrease when the coil temperature Tc exceeds the single system operation coil temperature Tc_S.

The first current limit calculation section 56 calculates the first relay current limiting value Ir1_lim based on the first relay temperature Tr1.

In addition, the first current limit calculation section 56 calculates the coil current limiting value Ic_lim based on the coil temperature Tc.

The second current limit calculation section 57 calculates the second relay current limiting value Ir2_lim based on the second relay temperature Tr2.

In addition, the second current limit calculation section 57 calculates the coil current limiting value Ic_lim based on the coil temperature Tc.

The selection sections 63 and 64 select the relay current limiting values Ir1_lim and Ir2_lim and or the coil current limiting value Ic_lim depending on whether all the plurality of systems are operated or some (one or more but not all) of the plurality of systems are operated.

The dual system operation relay temperature Tr_T differs from the single system operation relay temperature Tr_S. The dual system operation coil temperature Tc_T differs from the single system operation coil temperature Tc_S.

Hence, the selection sections 63 and 64 compare the relay temperature difference $\Delta Tr\_D$ with the coil temperature difference $\Delta Tc\_D$. According to this comparison, the selection sections 63 and 64 can perform selection depending on a case of the dual system operation or a case of the single system operation.

Figure 7:
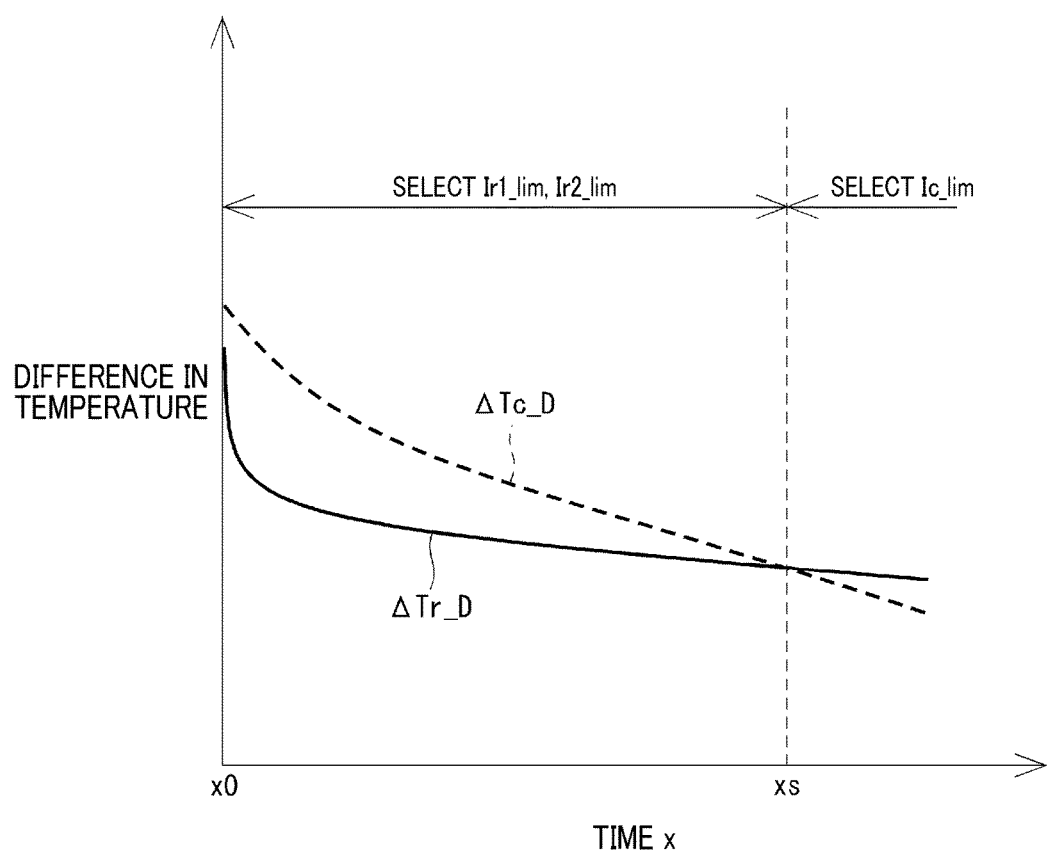
FIG. 7 is a diagram illustrating a relationship between time, differences in relay temperature, and differences in coil temperature in the motor control apparatus according to the first embodiment.

As shown in FIG. 7, as the time x passes, the relay temperature difference $\Delta Tr\_D$ and the coil temperature difference $\Delta Tc\_C$ decrease. In FIG. 7, the relay temperature difference $\Delta Tr\_D$ is indicated by a solid line, and the coil temperature difference $\Delta Tc\_D$ is indicated by a broken line.

From the time x0 to time xs, the relay temperature difference $\Delta Tr\_D$ is smaller than the coil temperature difference $\Delta Tc\_D$. At this time period, the selection sections 63 and 64 select the relay current limiting values Ir1_lim and Ir2_lim. The first selection section 63 selects the first relay current limiting value Ir1_lim. The second selection section 64 selects the second relay current limiting value Ir2_lim.

After the time xs, the coil temperature difference $\Delta Tc\_D$ is smaller than the relay temperature difference $\Delta Tr\_D$. At this time period, the selection sections 63 and 64 select the coil current limiting value Ic_lim.

The current command values determined based on a torque command value and the like and used before the limitation by the selection sections 63 and 64 are referred to as pre-limitation q axis current command values Iq1*_b and Iq2*_b.

When the first relay current limiting value Ir1_lim is selected, and if the first pre-limitation q axis current command value Iq1*_b is larger than the first relay current limiting value Ir1_lim, the first current limiting section 58 sets the first q axis current command value Iq1* to the first relay current limiting value Ir1_lim.

In addition, when the coil current limiting value Ic_lim is selected, and if the first pre-limitation q axis current command value Iq1*_b is larger than the coil current limiting value Ic_lim, the first current limiting section 58 sets the first q axis current command value Iq1* to the coil current limiting value Ic_lim.

When the second relay current limiting value Ir2_lim is selected, and if the second pre-limitation q axis current command value Iq2*_b is larger than the second relay current limiting value Ir2_lim, the second current limiting section 59 sets the second q axis current command value Iq2* to the second relay current limiting value Ir2_lim.

In addition, when the coil current limiting value Ic_lim is selected, and if the second pre-limitation q axis current command value Iq2*_b is larger than the coil current limiting value Ic_lim, the second current limiting section 59 sets the second q axis current command value Iq2* to the coil current limiting value Ic_lim.

Similarly, the d axis current command values Id1* and Id2* are also calculated by using values concerning the d axis current.

Figure 8:
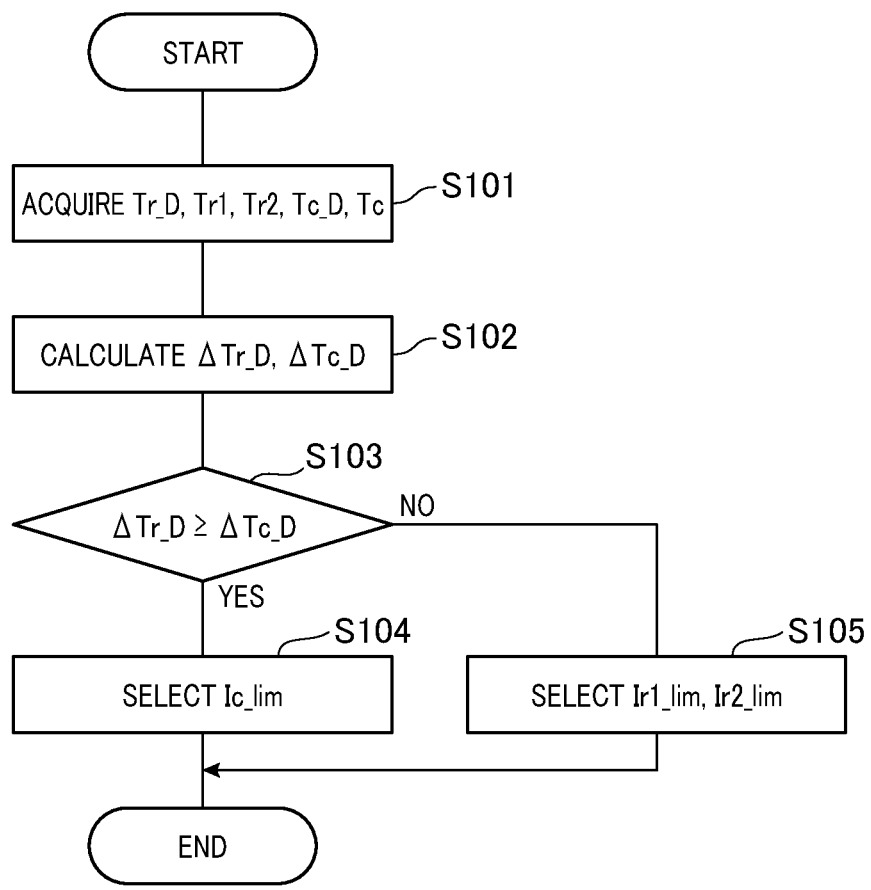
FIG. 8 is a flowchart for illustrating a process of a selection section of the motor control apparatus according to the first embodiment.

The process of the selection sections 63 and 64 is described with reference to the flowchart shown in FIG. 8. In the flowchart, sign "S" indicates a step.

In step 101, the selection sections 63 and 64 acquire the relay heat-resistant temperature Tr_D, the coil heat-resistant temperature Tc_D, the relay temperatures Tr1 and Tr2, and the coil temperature Tc.

In step 102, the selection sections 63 and 64 calculate the relay temperature difference $\Delta Tr\_D$ and the coil temperature difference $\Delta Tc\_D$.

In step 103, the selection sections 63 and 64 compare the relay temperature difference $\Delta Tr\_D$ with the coil temperature difference $\Delta Tc\_D$.

If the relay temperature difference $\Delta Tr\_D$ is the coil temperature difference $\Delta Tc\_D$ or more, the present process proceeds to step 104.

If the relay temperature difference $\Delta Tr\_D$ is less than the coil temperature difference $\Delta Tc\_D$, the present process proceeds to step 105.

In step 104, the selection sections 63 and 64 select the coil current limiting value Ic_lim. Then, the present process ends.

In step 105, the selection sections 63 and 64 select the relay current limiting values Ir1_lim and Ir2_lim. Then, the present process ends.

(Effects)

[1] The magnitude relationships between the relay temperatures Tr1 and Tr2 and the coil temperature Tc may differ between when the dual systems are operated and the single system is operated. Hence, the amount of temperature change may be estimated as large, and current maybe be limited excessively.

The selection sections 63 and 64 select a value to be estimated from the relay current limiting values Ir1_lim and Ir2_lim and the coil current limiting value Ic_lim depending on whether the dual systems are operated or the single system is operated. Hence, the amount of temperature change is not estimated as large. Thus, even in the case of a plurality of systems, accuracy in temperature estimation of temperature estimation section 60 is improved, whereby excessive current limitation is avoided.

[2] The relay current limiting values Ir1_lim and Ir2_lim are set based on the relay temperatures Tr1 and Tr2. The coil current limiting value Ic_lim is set based on the coil temperature Tc. Since the excess current is restricted, sufficient performance of the motor 80 can be offered, and the influence of heat on the motor can be decreased.

[3] The selection sections 63 and 64 select a value to be estimated from the relay current limiting values Ir1_lim and Ir2_lim and the coil current limiting value Ic_lim by using the relay temperature difference $\Delta Tr\_D$ and the coil temperature difference $\Delta Tc\_D$. Hence, the selection sections 63 and 64 can perform the calculation easily.

[4] The temperature estimation section 60 has the plurality of first-order lag calculators 610 to 612. Thereby, accuracy in temperature estimation of the temperature estimation section 60 is further improved.

Second Embodiment

The second embodiment is similar to the first embodiment, except for the process of the selection sections.

Figure 9:
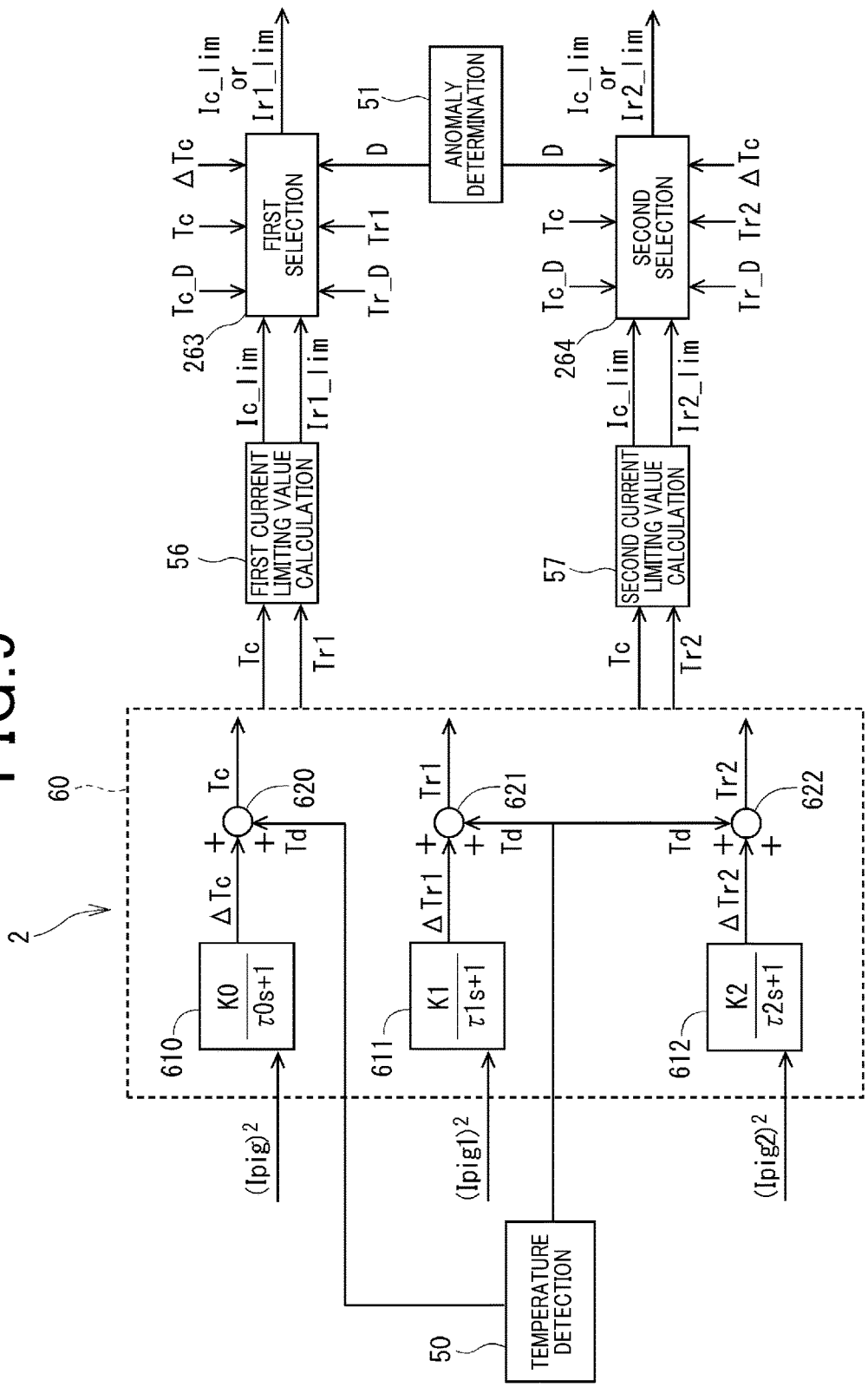
FIG. 9 is a block diagram of a temperature estimation section of a motor control apparatus according to a second embodiment.

As shown in FIG. 9, selection sections 263 and 264 of a motor control apparatus 2 of the second embodiment acquire the coil temperature change amount ΔTc.

The value obtained by multiplying the coil temperature change amount ΔTc by $1/N^2$ is referred to as a coil temperature conversion value ΔTc_C.

The coil temperature conversion value ΔTc_C is represented as the following relational expression (7). In the present embodiment, N=2.

The selection sections 263 and 264 compare the coil temperature conversion value ΔTc_C with the relay temperature change amount ΔTr to select the relay temperatures Tr1 and Tr2 or the coil temperature Tc.

$$\Delta Tc\_C = \Delta Tc \cdot 1/N^2 \tag{7}$$

Figure 10:
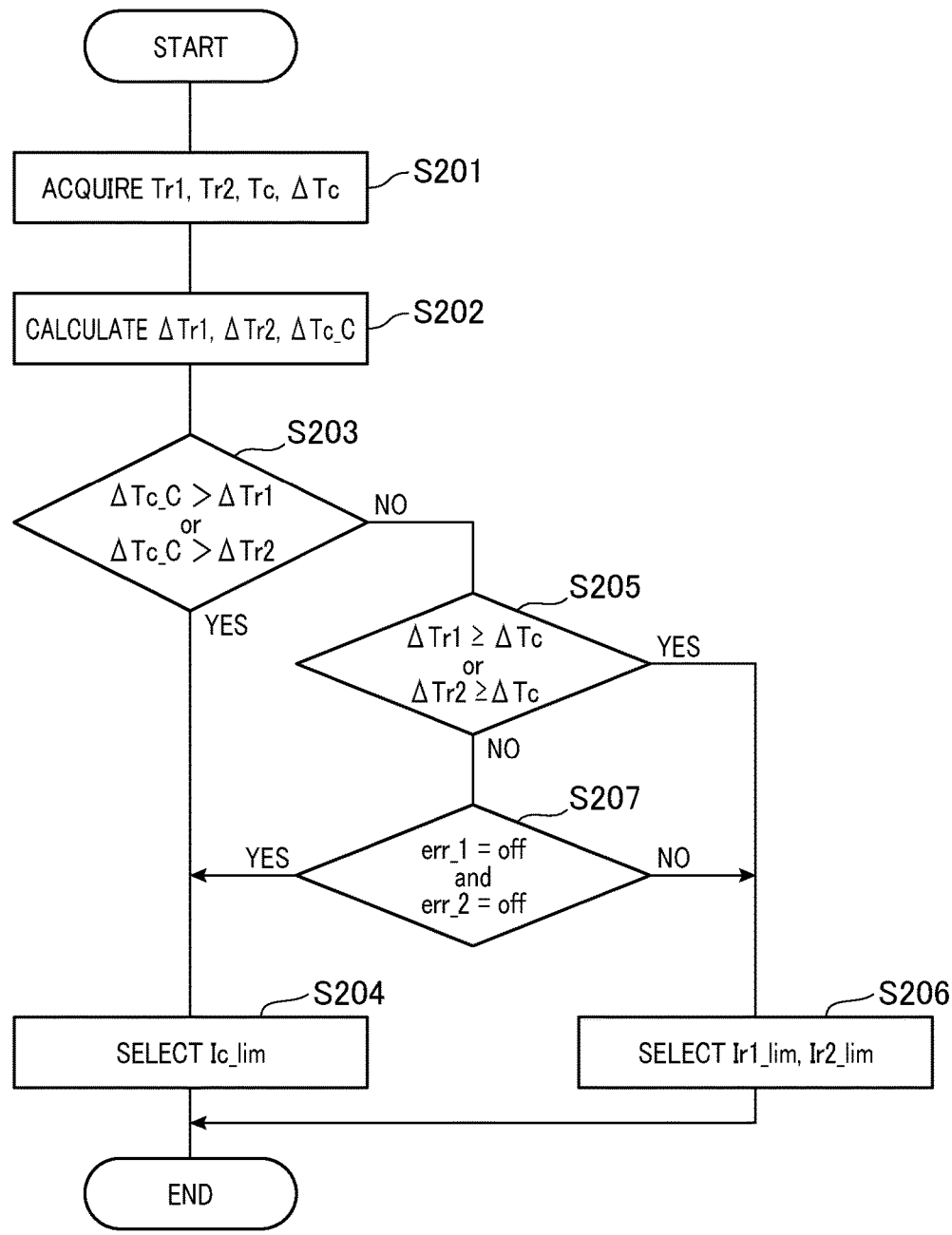
FIG. 10 is a flowchart for illustrating a process of a selection section of the motor control apparatus according to the second embodiment.

The process of the selection sections 263 and 264 will be described with reference to the flowchart shown in FIG. 10.

In step 201, the selection sections 263 and 264 acquire the relay temperatures Tr1 and Tr2, the coil temperature Tc, and the coil temperature change amount ΔTc.

In step 202, the selection sections 263 and 264 calculate the relay temperature change amount ΔTr1 and ΔTr2 and the coil temperature conversion value ΔTc_C.

In step 203, the selection sections 263 and 264 compare the coil temperature conversion value ΔTc_C with the relay temperature change amount ΔTr1 and ΔTr2.

If the coil temperature conversion value ΔTc_C is more than the relay temperature change amount ΔTr1 and ΔTr2, the present process proceeds to step 204.

If the coil temperature conversion value ΔTc_C is the relay temperature change amount ΔTr1 and ΔTr2 or less, the present process proceeds to step 205.

In step 204, the selection sections 263 and 264 select the coil current limiting value Ic_lim. Then, the present process ends.

In step 205, the selection sections 263 and 264 compare the relay temperature change amount ΔTr1 and ΔTr2 with the coil temperature change amount ΔTc. In step 205, the selection sections 263 and 264 may select the relay temperatures Tr1 and Tr2. Then, the present process ends.

If the coil temperature change amount ΔTc is the relay temperature change amount ΔTr1 and ΔTr2 or less, the present process proceeds to step 206.

If the coil temperature change amount ΔTc is more than the relay temperature change amount ΔTr1 and ΔTr2, the present process proceeds to step 207.

In step 206, the selection sections 263 and 264 select the relay current limiting values Ir1_lim and Ir2_lim. Then, the present process ends.

In step 207, the anomaly determination section 51 determines whether or not an anomaly has occurred in the first system or the second system. In the flowchart shown in FIG. 10, err_1=off indicates that the first system is in a normal state, err_1=on indicates that the first system is in an abnormal state, err_2=off indicates that the second system is in a normal state, and err_2=on indicates that the second system is in an abnormal state.

If the anomaly determination section 51 determines that the first system and the second system are in normal states, the present process proceeds to step 204.

If the anomaly determination section 51 determines that an anomaly has occurred in the first system or the second system, the process proceeds to step 206.

According to the process describe above, the effects similar to those of the first embodiment can be provided.

Third Embodiment

The third embodiment is similar to the first embodiment, except for the configuration of the first-order lag calculator of the temperature estimation section.

Figure 11:
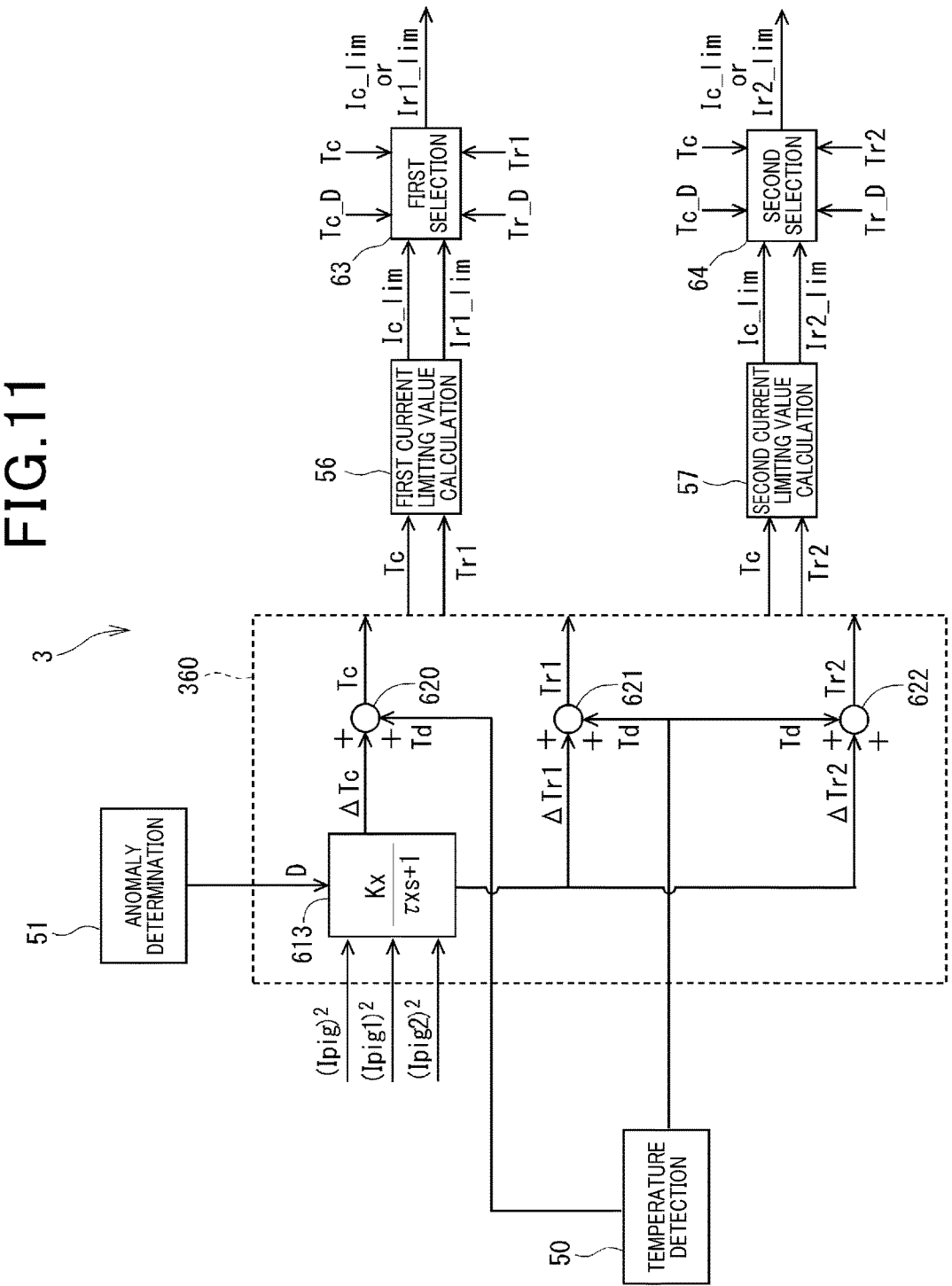
FIG. 11 is a block diagram of a temperature estimation section of a motor control apparatus according to a third embodiment.

As shown in FIG. 11, a temperature estimation section 360 of a motor control apparatus 3 according to the third embodiment has one first-order lag calculator 613.

The first-order lag calculator 613 receives a gain Kx and a time constant τx.

In addition, the first-order lag calculator 613 receives relay current square values $(Ipig1)^2$ and $(Ipig2)^2$ or a coil current square value $(Ipig)^2$.

The first-order lag calculator 613 calculates a first-order lag response from the inputs by using a transfer function satisfying the relational expression (8).

The first-order lag calculator 613 calculates the relay temperature change amount ΔTr1 and ΔTr2 or the coil temperature change amount ΔTc.

$$Kx(\tau x \cdot s + 1) \tag{8}$$

Figure 12:
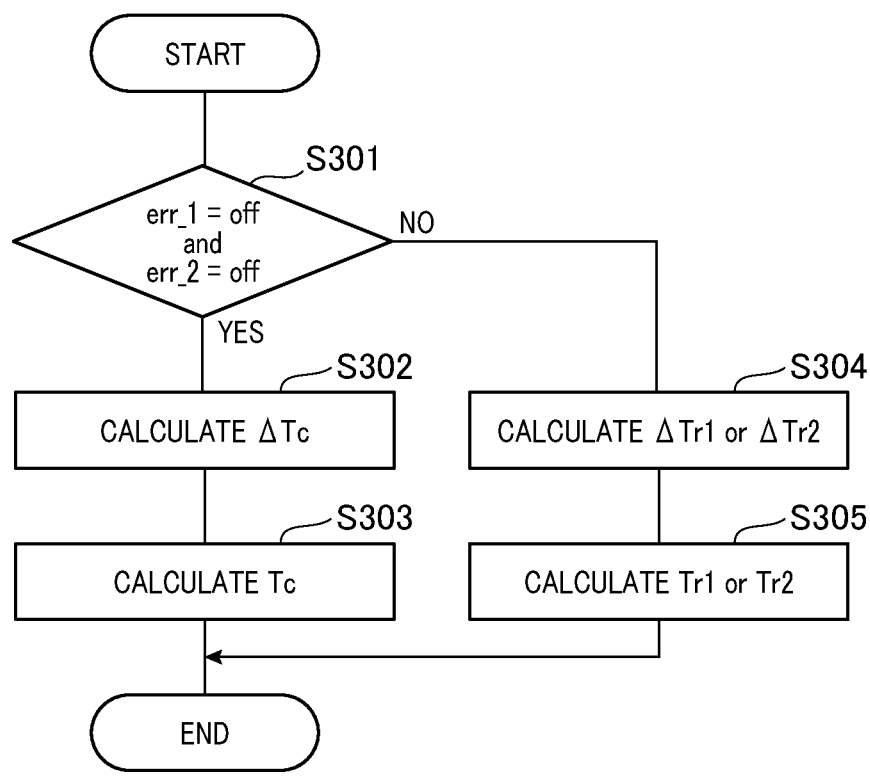
FIG. 12 is a flowchart for illustrating a process of a first-order lag calculator of the motor control apparatus according to the third embodiment.

The process of the first-order lag calculator 613 will be described with reference to the flowchart shown in FIG. 12.

In step 301, the anomaly determination section 51 determines whether or not an anomaly has occurred in the first system or the second system.

If the anomaly determination section 51 determines that the first system and the second system are in normal states, the present process proceeds to step 302.

If the anomaly determination section 51 determines that an anomaly has occurred in the first system or the second system, the process proceeds to step 304.

In step 302, the first-order lag calculator 613 calculates the coil temperature change amount ΔTc.

In step 303, the adder 620 adds the detection temperature Td to the coil temperature change amount ΔTc to calculate the coil temperature Tc. Then, the present process ends.

In step 304, the first-order lag calculator 613 calculates the first relay temperature change amount ΔTr1 or the second relay temperature change amount Tr2.

In step 305, the adder 621 adds the detection temperature Td to the first relay temperature change amount ΔTr1 to calculate the first relay temperature Tr1. Alternatively, the adder 622 adds the detection temperature Td to the second relay temperature change amount ΔTr2 to calculate the second relay temperature Tr2. Then, the present process ends.

In the third embodiment, the first-order lag calculator 613 calculates the relay temperatures Tr1 and Tr2 or the coil temperature Tc depending on a case of the dual system operation or a case of the single system operation.

According to the process describe above, the effects similar to those of the first embodiment can be provided.

Forth Embodiment

The forth embodiment is similar to the first embodiment, except that the control section further has an electric power control section.

An electric power control section 73 controls electric power to be supplied to inverters so that when some (one or more but not all) of the plurality of systems are operated, the inverters that are operating are supplied with electric power that should have been supplied to the inverters of the system that is not operated.

Figure 13:
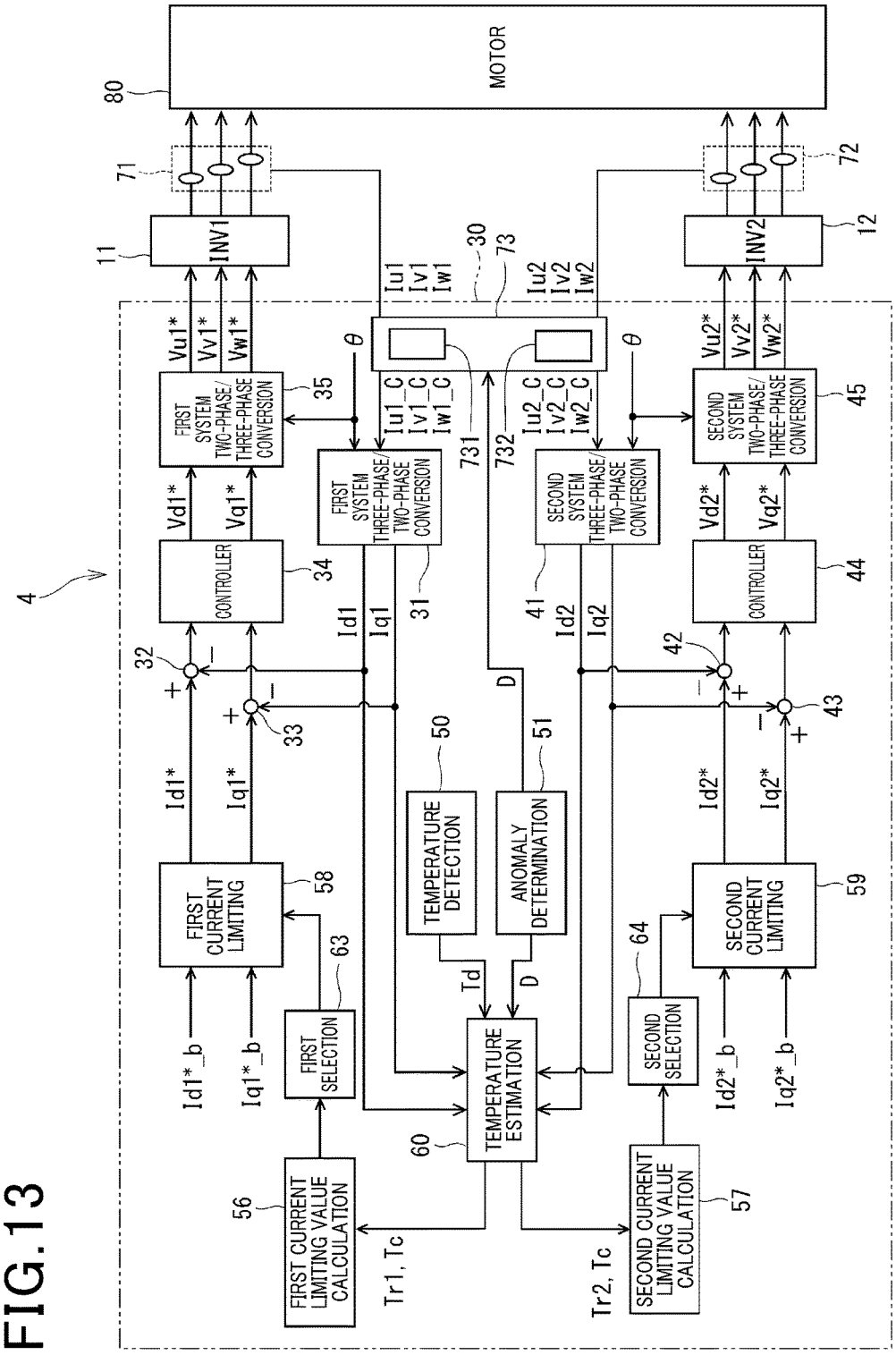
FIG. 13 is a block diagram of a control section of a motor control apparatus according to a fourth embodiment.

As shown in FIG. 13, the electric power control section 73 of a motor control apparatus 4 according to the fourth embodiment has phase current conversion sections 731 and 732.

The first phase current conversion section 731 converts the phase currents Iu1, Iv1, and Iw1 to phase current converted values Iu1_C, Iv1_C, and Iw1_C.

The first phase current conversion section 731 outputs the phase current converted values Iu1_C, Iv1_C, and Iw1_C to the first system three-phase two-phase conversion section 31.

The phase currents Iu1, Iv1, and Iw1 and the phase current converted values Iu1_C, Iv1_C, and Iw1_C are set so as to satisfy the following relational expressions (9) to (11). G1 indicates a gain.

$$Iu1\_C = G1 \cdot Iu1 \tag{9}$$

$$Iv1\_C = G1 \cdot Iv1 \tag{10}$$

$$Iw1\_C = G1 \cdot Iw1 \tag{11}$$

The second phase current conversion section 732 converts the phase currents Iu2, Iv2, and Iw2 to phase current converted values Iu2_C, Iv2_C, and Iw2_C.

The second phase current conversion section 732 outputs the phase current converted values Iu2_C, Iv2_C, and Iw2_C to the second system three-phase two-phase conversion section 41.

The phase currents Iu2, Iv2, and Iw2 and the phase current converted values Iu2_C, Iv2_C, and Iw2_C are set so as to satisfy the following relational expressions (12) to (14). G2 indicates a gain.

The three-phase two-phase conversion sections 31 and 41 perform a process similar to that in the first embodiment.

$$Iu2\_C = G2 \cdot Iu2 \tag{12}$$

$$Iv2\_C = G2 \cdot Iv2 \tag{13}$$

$$Iw2\_C = G1 \cdot Iw2 \tag{14}$$

Figure 14:
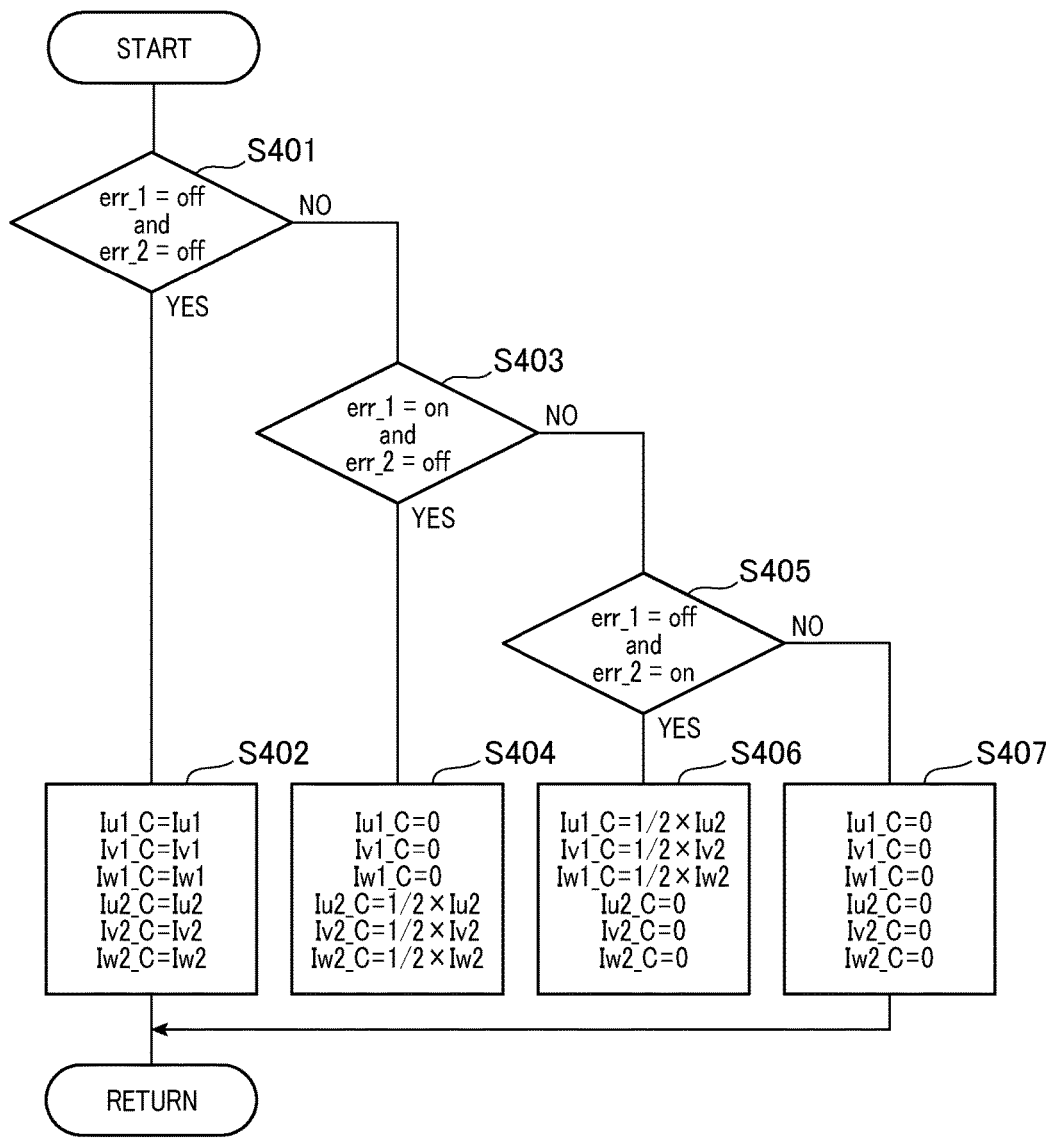
FIG. 14 is a flowchart for illustrating a process of a power control section of the motor control apparatus according to the fourth embodiment.

The process of the electric power control section 73 will be described with reference to the flowchart shown in FIG. 14.

In step 401, the anomaly determination section 51 determines whether or not an anomaly has occurred in the first system or the second system.

If the anomaly determination section 51 determines that the first system and the second system are in normal states, the present process proceeds to step 402.

If the anomaly determination section 51 determines that an anomaly has occurred in the first system or the second system, the process proceeds to step 403.

In step 402, the phase current conversion sections 731 and 732 output Iu1_C, Iv1_C, Iw1_C, Iu2_C, Iv2_C, and Iw2_C. Then, the present process ends.

In step 403, the anomaly determination section 51 determines whether the first system is in an abnormal state and the second system is in a normal state.

If the anomaly determination section 51 determines that the first system is in an abnormal state and the second system is in a normal state, the process proceeds to step 404.

If the anomaly determination section 51 determines that the first system is not in an abnormal state or the second system is not in a normal state, the process proceeds to step 405.

In step 404, the first phase current conversion section 731 sets the gain G1 of the first system to 0. The second phase current conversion section 732 sets the gain G2 of the second system to 1/2.

The phase current conversion sections 731 and 732 output Iu1_C, Iv1_C, Iw1_C, Iu2_C, Iv2_C, and Iw2_C. Then, the present process ends.

In step 405, the anomaly determination section 51 determines whether the first system is in a normal state and the second system is in an abnormal state.

If the anomaly determination section 51 determines that the first system is in a normal state and the second system is in an abnormal state, the process proceeds to step 406.

If the anomaly determination section 51 determines that the first system is not in a normal state or the second system is not in an abnormal state, the process proceeds to step 407.

In step 406, the first phase current conversion section 731 sets the gain G1 of the first system to 1/2. The second phase current conversion section 732 sets the gain G2 of the second system to 0.

The phase current conversion sections 731 and 732 output Iu1_C, Iv1_C, Iw1_C, Iu2_C, Iv2_C, and Iw2_C. Then, the present process ends.

In step 407, the anomaly determination section 51 determines that the first system is in an abnormal state and the second system is in an abnormal state.

The first phase current conversion section 731 sets the gain G1 of the first system to 0. The second phase current conversion section 732 sets the gain G2 of the second system to 0. Then, the present process ends.

As described above, in the case of the two systems, when only one system is operated, phase current of the normal system is not used without change. The phase current conversion sections 731 and 732 convert the phase currents to phase current converted values by setting the gains G1 and G2 to 1/2.

A case where M systems included in a total of N systems are operated will be described. M is an integer more than 0 and equal to or less than N. Each gain of the operated M systems is defined as Gx. The gain Gx is set so as to satisfy the following relational expression (15).

$$Gx = M/N \tag{15}$$

Except for the case where M is equal to N, the gain Gx is less than 1. The three-phase two-phase conversion section recognizes that there is a system, through which current is not flowing, included in the other systems and feeds it back to the controller. The controller that has been subjected to the feedback commands the system in question to apply a current that is a multiple of the reciprocal of the gain G. As a whole, current for N systems flows, whereby the sum of outputs of the inverters can be kept constant.

Other Embodiments (i) The rotary electric machine is not limited to a three-phase AC motor but may be four-phase or more multiple-phase AC motor. The rotary electric machine may have three or more winding sets. The number of systems may be three or more. The rotary electric machine is not limited to a motor, but may be a generator or a motor generator having both functions of a motor and a generator.

(ii) In the present embodiment, the rotary electrical machine and the rotary electrical machine control apparatus are integrated. However, the rotary electrical machine and the rotary electrical machine control apparatus may be separately provided.

(iii) The switching elements may have individual electrical characteristics and heat release characteristics. Even if the elements having individual electrical characteristics and heat release characteristics are used, the present embodiment is useful and provides effects similar to those of the first embodiment.

(iv) The average value of integrated values of the first relay current square values $(Ipig1)^2$ or the second relay current square values $(Ipig2)^2$ with respect to time is referred to as a relay current average value. The average value of integrated values of the coil current square values $(Ipig)^2$ with respect to time is referred to as a coil current average value.

The first-order lag calculators of the temperature estimation section may receive the relay current average value or the coil current average value to calculate the relay temperature change amounts ΔTr1 and ΔTr2 or the coil temperature change amount ΔTc.

(v) The temperature of the first reverse connection protection relay 15 is referred to as a first reverse connection relay temperature Tp1. The temperature of the second reverse connection protection relay 16 is referred to as a second reverse connection relay temperature Tp2. The amount of change of the first reverse connection relay temperature Tp1 due to the current application is referred to as a first reverse connection relay temperature change amount ΔTp1. The amount of change of the second reverse connection relay temperature Tp2 due to the current application is referred to as a second reverse connection relay temperature change amount ΔTp2. The current limiting values calculated based on the reverse connection relay temperatures Tp1 and Tp2 are referred to as protection relay current limiting values Ip1_lim and Ip2_lim.

The protection relay current limiting values Ip1_lim and Ip2_lim are set based on the reverse connection relay temperatures Tp1 and Tp2 as in the case of the relay current limiting values Ir1_lim and Ir2_lim.

Figure 15:
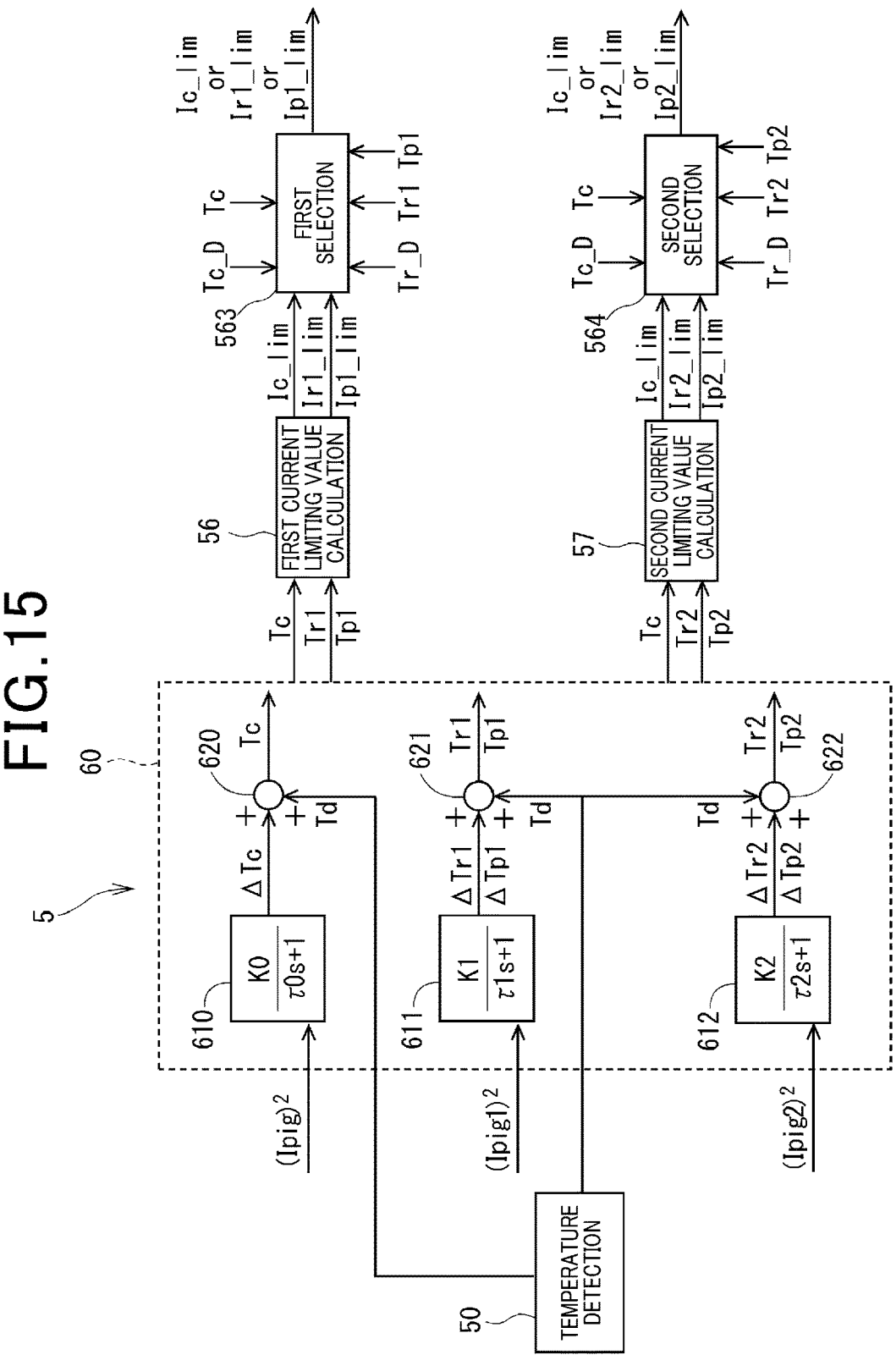
FIG. 15 is a block diagram of a control section of a motor control apparatus according to another embodiment.

As shown in FIG. 15, selection sections 563 and 564 of a motor control apparatus 5 may select any of the relay current limiting values Ir1_lim and Ir2_lim, the coil current limiting value Ic_lim, and the protection relay current limiting values Ip1_lim and Ip2_lim.

The first-order lag calculator 611 calculates the relay temperature change amount ΔTr1 and the first reverse connection relay temperature change amount ΔTp1.

The adder 621 adds the detection temperature Td to the first reverse connection relay temperature change amount ΔTp1 to calculate the first reverse connection relay temperature Tp1.

The adder 622 adds the detection temperature Td to the second reverse connection relay temperature change amount ΔTp2 to calculate the second reverse connection relay temperature Tp2.

The selection sections 563 and 564 additionally calculate a reverse connection relay temperature difference ΔTp_D, which is the difference between a heat-resistant temperature Tp_D of the reverse connection protection relays 15 and 16 and the reverse connection relay temperature Tp1, Tp2.

In addition, the selection sections compare the relay temperature difference ΔTr_D, the reverse connection relay temperature difference ΔTp_D, and the coil temperature difference ΔTc_D to select the relay temperature Tr1, Tr2, the reverse connection relay temperature Tp1, Tp2, or the coil temperature Tc.

(vi) As shown in FIG. 16, a selection section 663 of the motor control apparatus 6 may be configured by integrating the first selection section and the second selection section.

In addition, before the current limit calculation sections 56 and 57 perform calculation, the selection section 663 selects the temperatures to be output to the current limit calculation sections 56 and 57 based on the relay temperatures Tr1 and Tr2 and the coil temperature Tc1.

The current limit calculation sections 56 and 57 may calculate current limiting values based on the temperatures selected by the selection section 663.

It will be appreciated that the present invention is not limited to the configurations described above, but any and all modifications, variations or equivalents, which may occur to those who are skilled in the art, should be considered to fall within the scope of the present invention.

Hereinafter, an aspect of the above-described embodiments will be summarized.

As an aspect of the embodiment, a rotary electrical machine control apparatus is provided which controls a rotary electrical machine (80) having a plurality of winding sets (81, 82).

The rotary electrical machine control apparatus includes inverters (11, 12), power supply relays (13, 14), a choke coil (17), a substrate (18), a heatsink (19), a temperature detection section (50), a temperature estimation section (60), a current limit calculation section (56, 57), and a selection section (63, 64, 263, 264, 563, 564).

The inverters are provided so as to respectively correspond to the winding sets and have a plurality of switching elements (111-116, 121-126).

The power supply relays are provided so as to respectively correspond to the winding sets and allow current to flow to the inverters or interrupt the flow.

The choke coil is provided between a power supply (9) and the power supply relays to suppress noise.

The inverters, the power supply relays, and the choke coil are mounted on the substrate.

The heatsink releases heat of the switching elements.

The temperature detection section detects a temperature (Tb) of the substrate, a temperature (Th) of the heatsink, or an outside air temperature (Ta).

The temperature estimation section estimates temperatures (Tr1, Tr2) of the power supply relays or a temperature (Tc) of the choke coil based on temperature change amounts (ΔTr1, ΔTr2) of the power supply relays, a temperature change amount (ΔTc) of the choke coil, and a temperature (Td) detected by the temperature detection section.

The current limit calculation section calculates a current limiting value, which is a limiting value of a current flowing from the power supply to the inverter, based on the temperature of the power supply relay and the temperature of the choke coil.

The selection section selects a relay current limiting value (Ir1_lim, Ir2_lim) or a coil current limiting value (Ic_lim) depending on whether a plurality of systems are operated or one or more but not all of the plurality of systems are operated. The system is a combination of the winding set, the inverter, and the power supply relay, which correspond to each other. The relay current limiting value is the current limiting value calculated based on the temperature of the power supply relay. The coil current limiting value is the current limiting value calculated based on the temperature of the choke coil.

The magnitude relationships between the temperature of the power supply relay and the temperature of the choke coil differ between when all of the systems are operated and when one or more but not all of the systems are operated. Hence, the amount of temperature change was estimated as large though the temperature was estimated. Selecting the relay current limiting value or the coil current limiting value depending on whether all of the systems are operated or one or more but not all of the systems are operated limits the current without estimating the amount of temperature change as large. Thus, even in the case of a plurality of systems, accuracy in temperature estimation is improved, whereby excessive current limitation is avoided.

In addition, as another aspect of the embodiment, an electric power steering apparatus is provided which includes a rotary electric machine (80) that outputs auxiliary torque assisting steering by a driver, and the rotary electrical machine control apparatus (1, 2, 3, 4).

The electric power steering apparatus provides effects similar to those of the above rotary electrical machine control apparatus.

What is claimed is:

1. A rotary electrical machine control apparatus that controls a rotary electrical machine having a plurality of winding sets, the apparatus comprising:
    inverters that are provided to correspond to the respective winding sets and have a plurality of switching elements;
    power supply relays that are provided to correspond to the respective winding sets and allow current to flow to the inverters or interrupt the flow;
    a choke coil that is provided between a power supply and the power supply relays to suppress noise;
    a substrate on which the inverters, the power supply relays, and the choke coil are mounted;
    a heatsink that releases heat of the switching elements;
    a temperature detection section that detects a temperature of the substrate, a temperature of the heatsink, or an outside air temperature;
    a temperature estimation section that estimates temperatures of the power supply relays or a temperature of the choke coil based on temperature change amounts of the power supply relays, a temperature change amount of the choke coil, and a temperature detected by the temperature detection section;
    a current limit calculation section that calculates a current limiting value, which is a limiting value of a current flowing from the power supply to the inverter, based on the temperature of the power supply relay and the temperature of the choke coil;
    a selection section that selects a relay current limiting value or a coil current limiting value depending on whether a plurality of systems are operated or one or more but not all of the plurality of systems are operated, wherein the system is a combination of the winding set, the inverter, and the power supply relay, which correspond to each other, the relay current limiting value is the current limiting value calculated based on the temperature of the power supply relay, and the coil current limiting value is the current limiting value calculated based on the temperature of the choke coil.

2. The rotary electrical machine control apparatus according to claim 1, wherein
    the selection section compares a relay temperature difference with a coil temperature difference to select the relay current limiting value or the coil current limiting value, wherein the relay temperature difference is a difference between a heat-resistant temperature of the power supply relay and a temperature of the power supply relay, and the coil temperature difference is a difference between a heat-resistant temperature of the choke coil and a temperature of the choke coil.

3. The rotary electrical machine control apparatus according to claim 2, wherein
    the selection section selects the coil current limiting value if the relay temperature difference is the coil temperature difference or more, and selects the relay current limiting value if the relay temperature difference is less than the coil temperature difference.

4. The rotary electrical machine control apparatus according to claim 1, wherein
    when the number of the systems is N,
    the selection section selects the coil current limiting value if a value obtained by multiplying the temperature change amount of the choke coil by $1/N^2$ is more than the temperature change amount of the power supply relay.

5. The rotary electrical machine control apparatus according to claim 1, wherein
    when the number of the systems is N, and
    if a value obtained by multiplying the temperature change amount of the choke coil by $1/N^2$ is equal to or less than the temperature change amount of the power supply relay, and the temperature change amount of the choke cod is larger than the temperature change amount of the power supply relay,
    when all the plurality of systems are operated, the selection section selects the coil current limiting value, and
    when one or more but fewer than N of the plurality of systems are operated, the selection section selects the relay current limiting value.

6. The rotary electrical machine control apparatus according to claim 1, wherein
    when the number of the systems is N,
    the selection section selects the relay current limiting value if a value obtained by multiplying the temperature change amount of the choke coil by $1/N^2$ is equal to or less than the temperature change amount of the power supply relay.

7. The rotary electrical machine control apparatus according to claim 1, wherein
    the temperature estimation section calculates, for the plurality of systems, the temperature change amount of the power supply relay and the temperature change amount of the choke coil based on a relay current square value, a relay current average value, a coil current square value, or a coil current average value, wherein
    the relay current square value is a square value of a current flowing to the power supply relay, the relay current average value is an average value of integrated values of the relay current square values with respect to time, the coil current square value is a square value of a current flowing to the choke coil, and the coil current average value is an average value of integrated values of the coil current square values with respect to time.

8. The rotary electrical machine control apparatus according to claim 1, further comprising reverse connection protection relays that are provided between the inverters and the power supply relays and interrupt a current from the inverter to the power supply relay, wherein
    the current limit calculation section calculates the current limiting value based on the temperature of the power supply relay, a temperature of the reverse connection protection relay, and the temperature of the choke coil,
    the selection section selects any of the relay current limiting value, the coil current limiting value, and a protection relay current limiting value depending on whether all the plurality of systems are operated or one or more but not all of the plurality of systems are operated, wherein the protection relay current limiting value is the current limiting value calculated based on the temperature of the reverse connection protection relay.

9. The rotary electrical machine control apparatus according to claim 1, further comprising an electric power control section that controls electric power to be supplied to the inverters so that when one or more but not all of the plurality of systems are operated, the inverter that is operating is supplied with electric power that should have been supplied to the inverter of the system that is not operated.

10. An electric power steering apparatus, comprising:
a rotary electric machine that outputs auxiliary torque assisting steering by a driver, and
the rotary electrical machine control apparatus according to claim 1.

* * * * *